(12) United States Patent
Torii

(10) Patent No.: US 6,735,127 B2
(45) Date of Patent: May 11, 2004

(54) METHOD FOR DRIVING A SEMICONDUCTOR MEMORY

(75) Inventor: Satoshi Torii, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/160,050

(22) Filed: Jun. 4, 2002

(65) Prior Publication Data
US 2002/0151123 A1 Oct. 17, 2002

Related U.S. Application Data

(62) Division of application No. 09/927,387, filed on Aug. 13, 2001, now Pat. No. 6,559,500.

(30) Foreign Application Priority Data

Mar. 29, 2001 (JP) ......................................... 2001-094582

(51) Int. Cl.[7] .............................................. G11C 16/04
(52) U.S. Cl. .......................... 365/185.29; 365/185.24; 365/185.18; 438/257; 257/314
(58) Field of Search ........................ 365/185.18, 185.24, 365/185.27–185.29; 438/257–259; 257/314, 315

(56) References Cited

U.S. PATENT DOCUMENTS 5,838,041 A * 11/1998 Sakagami et al. .......... 257/324
6,376,295 B1 * 4/2002 Naruke et al. .............. 438/217

FOREIGN PATENT DOCUMENTS

| JP | 6-21404 | 1/1994 |
| JP | 7-57485 | 3/1995 |
| JP | 9-307009 | 11/1997 |

* cited by examiner

Primary Examiner—Dung Le
(74) Attorney, Agent, or Firm—Armstrong, Kratz, Quintos, Hanson & Brooks, LLP

(57) ABSTRACT

A method of driving a semiconductor memory having a semiconductor substrate, spaced apart first and second impurity diffusion regions disposed in partial surface layers of the substrate, a gate electrode, and a gate insulating film between a channel region and the gate electrode. A portion is disposed in a partial area along the longitudinal direction of a path interconnecting the diffusion regions, and a charge trap film and a second insulating film are sequentially stacked, the charge trap film being made of insulating material easier to trap electrons than the first and second insulating films. The method has a hole drain step of draining holes trapped in each film between the gate electrode and the channel region or at an interface between adjacent films, by applying a hole drain voltage to the gate electrode, higher than a voltage applied to either the first or second impurity diffusion region.

6 Claims, 22 Drawing Sheets

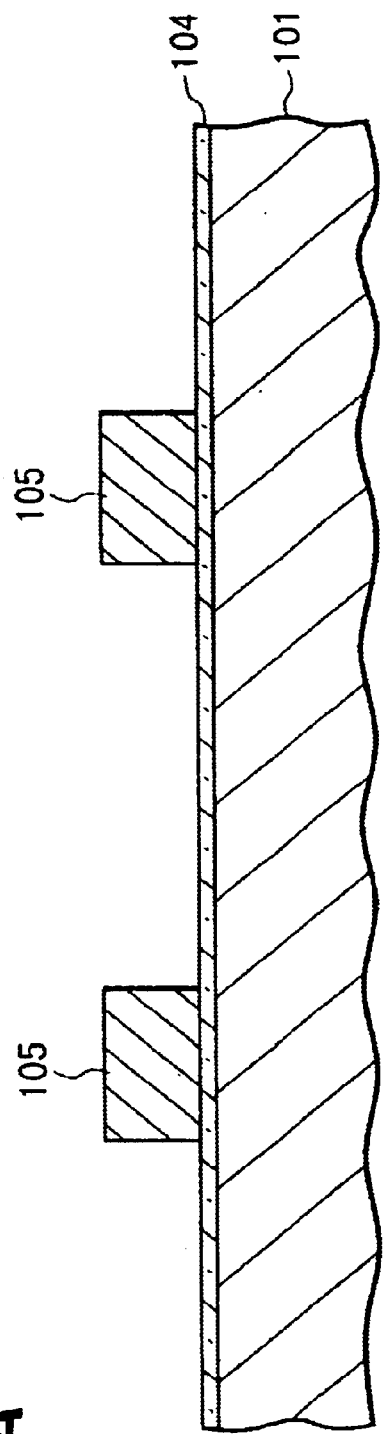
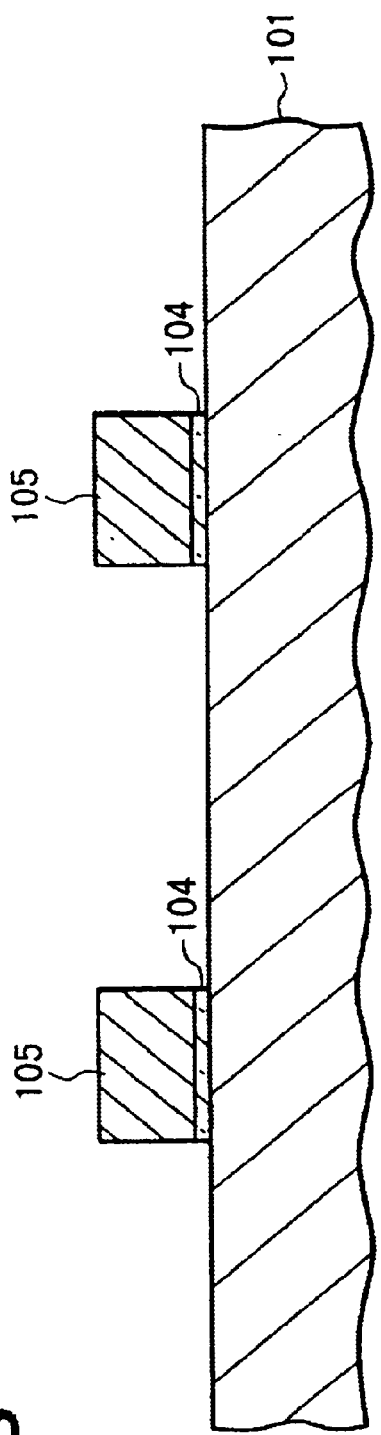
FIG.19A
FIG.19B

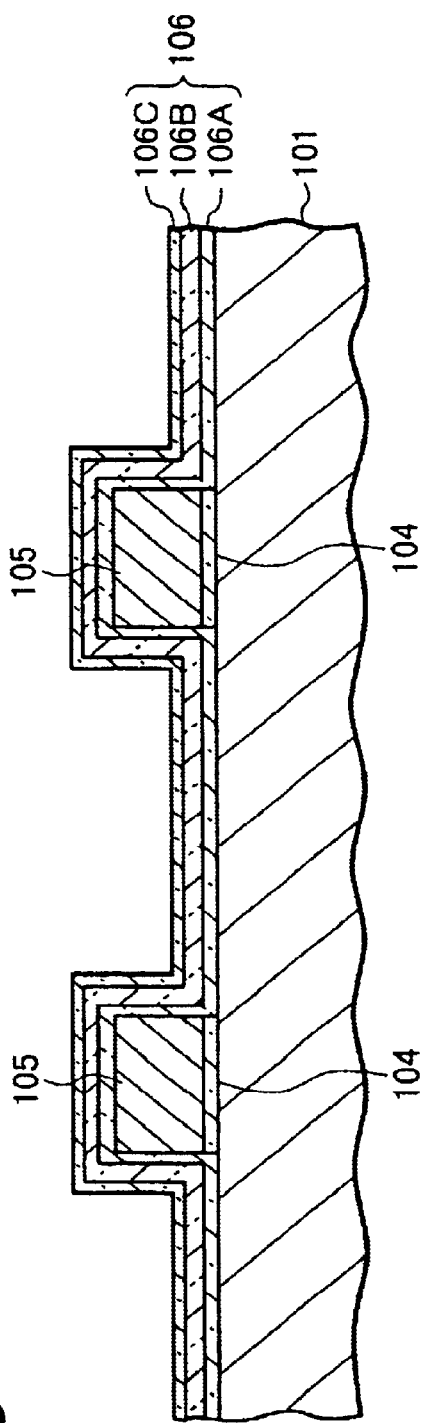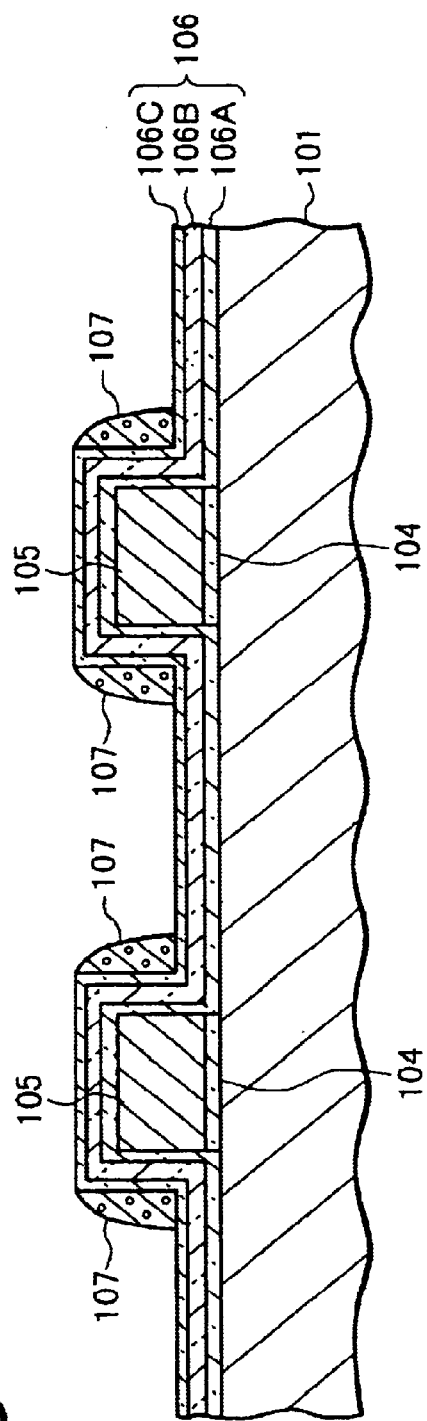

METHOD FOR DRIVING A SEMICONDUCTOR MEMORY

CROSS REFERENCE TO A RELATED PATENT.

The subject is a division of the application Ser. No. 09/927,387, now U.S. Pat. No. 6,559,500.

This application is based on Japanese Patent Application 2001-094582, filed on Mar. 29, 2001, the entire contents of which are incorporated herein by reference.

BACKGROUND OF THE INVENTION

1. Field of the Invention

The present invention relates to semiconductor memories and their driving methods, and more particularly to non-volatile semiconductor memories which store data by trapping electrons in an insulating film, and to its driving methods.

2. Description of the Related Art

In a non-volatile semiconductor memory such as an electrically erasable and programmable ROM (EEPROM) and a collectively and electrically erasable flash memory, a memory cell having a double gate structure of a floating gate and a control gate is generally used. Complicated manufacture processes for forming the double gate structure become an obstacle to micro patterning of semiconductor memories. Semiconductor memories using as a charge storing film an insulating film such as silicon nitride in place of a floating gate has been paid attention. A semiconductor memory of this structure stores data by capturing (trapping) charges in the insulating film such as silicon nitride.

As a semiconductor memory of this structure, a SONOS type memory is known. The gate insulating film of an FET constituting each cell of a SONOS type memory has a three-layer structure having a silicon nitride film sandwiched between silicon oxide films. Data is written by injecting electrons into the silicon nitride film, and data is erased by draining electrons.

As compared to a floating gate type memory, a SONOS type memory has a simpler gate structure so that it is suitable for realizing a memory cell of a micro size. However, a sufficiently large number of rewrite operations is not still possible and SONOS type memories are not in practical use.

SUMMARY OF THE INVENTION

It is an object of the present invention to provide semiconductor memories and their driving methods, capable of increasing the number of rewrite operations.

According to one aspect of the present invention, there is provided a semiconductor memory comprising: a semiconductor substrate; first and second impurity diffusion regions disposed in partial surface layers of the semiconductor substrate and being spaced apart by some distance; a gate electrode formed above a channel region defined between the first and second impurity diffusion regions; a gate insulating film disposed between the channel region and the gate electrode, of the gate insulating film, a portion disposed at least in a partial area along the longitudinal direction of a path interconnecting the first and second impurity diffusion regions, having a lamination structure of a first insulating film, a charge trap film and a second insulating film sequentially stacked in this order, the charge trap film being made of insulating material easier to trap electrons than the first and second insulating films; and a control circuit for performing a hole drain operation of draining holes trapped in each film between the gate electrode and the channel region or at an interface between adjacent films, by applying a hole drain voltage to the gate electrode, the hole drain voltage being higher than a voltage applied to either the first or second impurity diffusion region.

By draining holes trapped in each film between the gate electrode and the channel region or at an interface between adjacent films, it becomes possible to prevent the write speed and erase speed from being lowered even if a rewrite operation is repeated.

According to another aspect of the present invention, there is provided a semiconductor memory comprising: a semiconductor substrate; first and second impurity diffusion regions disposed in partial surface layers of the semiconductor substrate and being spaced apart by some distance; a gate electrode formed above a channel region defined between the first and second impurity diffusion regions; a gate insulating film disposed between the channel region and the gate electrode, of the gate insulating film, a portion disposed at least in a partial area along the longitudinal direction of a path interconnecting the first and second impurity diffusion regions, having a lamination structure of a first insulating film, a charge trap film and a second insulating film sequentially stacked in this order, the charge trap film being made of insulating material easier to trap electrons than the first and second insulating films; and a control circuit for applying a same voltage to the first and second impurity diffusion regions and a first positive voltage to the gate electrode, the first positive voltage being higher than the voltage applied to the first and second impurity diffusion regions.

By applying the first voltage to the gate electrode, it becomes possible to drain holes trapped in each film between the gate electrode and the channel region or at an interface between adjacent films. It is therefore possible to prevent the write speed and erase speed from being lowered even if a rewrite operation is repeated.

According to another aspect of the present invention, there is provided a semiconductor memory comprising: a semiconductor substrate; a plurality of bit lines formed on the semiconductor substrate, the bit lines extending along a first direction and disposed in parallel; a plurality of word lines disposed on the semiconductor substrate, the word lines extending along a second direction crossing the first direction and being disposed in parallel and electrically insulated from the bit lines at each cross point between the bit lines and the word lines; FET's disposed in cross areas between each stripe area between a pair of adjacent bit lines and a corresponding word line, each of the FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of the bit lines, and the gate electrode being connected to a corresponding one of the word lines; and a control circuit for draining holes trapped in each film between the gate electrode and the channel region or at an interface between adjacent films, by applying a first voltage to the plurality of bit lines and applying a second voltage to the plurality of word lines, the second voltage being higher than the first voltage.

By draining holes trapped in each film between the gate electrode and the channel region or at an interface between adjacent films, it becomes possible to prevent the write speed and erase speed from being lowered even if a rewrite operation is repeated.

According to another aspect of the present invention, there is provided a method of driving a semiconductor memory, wherein: the semiconductor memory comprises: a semiconductor substrate; first and second impurity diffusion regions disposed in partial surface layers of the semiconductor substrate and being spaced apart by some distance; a gate electrode formed above a channel region defined between the first and second impurity diffusion regions; and a gate insulating film disposed between the channel region and the gate electrode, of the gate insulating film, a portion disposed at least in a partial area along the longitudinal direction of a path interconnecting the first and second impurity diffusion regions, having a lamination structure of a first insulating film, a charge trap film and a second insulating film sequentially stacked in this order, the charge trap film being made of insulating material easier to trap electrons than the first and second insulating films, and the method comprises a hole drain step of draining holes trapped in each film between the gate electrode and the channel region or at an interface between adjacent films, by applying a hole drain voltage to the gate electrode, the hole drain voltage being higher than a voltage applied to either the first or second impurity diffusion region.

By draining holes trapped in each film between the gate electrode and the channel region or at an interface between adjacent films, it becomes possible to prevent the write speed and erase speed from being lowered even if a rewrite operation is repeated.

According to another aspect of the present invention, there is provided a semiconductor memory comprising: a semiconductor substrate; a plurality of bit lines formed on the semiconductor substrate, the bit lines extending along a first direction and disposed in parallel; a plurality of word lines disposed on the semiconductor substrate, the word lines extending along a second direction crossing the first direction and being disposed in parallel and electrically insulated from the bit lines at each cross point between the bit lines and the word lines; FET's disposed in cross areas between each stripe area between a pair of adjacent bit lines and a corresponding word line, each of the FET's including a pair of impurity diffusion regions of a first conductivity type, a channel region between the impurity diffusion regions, a gate insulating film formed on the channel region, and a gate electrode formed on the gate insulating film, the gate insulating film being disposed at least in a partial area along the longitudinal direction of a path interconnecting the pair of impurity diffusion regions and having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of the bit lines, and the gate electrode being connected to a corresponding one of the word lines; and a control circuit for performing an erase operation, a hole drain operation, an erase judgment operation, a write operation and a write judgment operation, the erase operation draining electrons trapped in each charge trap film of the FET's by applying a first voltage to each of the plurality of bit lines and applying a negative erase voltage lower than the first voltage to each of the plurality of word lines, the hole drain-operation draining holes trapped in each film between the gate electrode and the channel region of each of the FET's or at an interface between adjacent films, by applying a second voltage to each of the plurality of bit lines and applying a positive hole drain voltage higher than the second voltage to each of the plurality of word lines, the erase judgment operation applying a third voltage across a pair of bit lines corresponding to a selected FET among the FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among the FET's and applying a write voltage to a corresponding work line, to trap electrons in the charge trap film of the selected FET, and the write judgment operation applying a fifth voltage across a pair of bit lines corresponding to a selected FET among the FET's and applying a write judgment voltage to a corresponding word line, to compare a current flowing between the corresponding pair of bit lines with a reference current and judge whether the selected FET is in a write completion state or in a write incompletion state, wherein the control circuit executes: a step of performing the erase operation; a step of performing the hole drain operation after the erase operation; and a step of selecting each of the FET's subjected to the erase operation and performing the erase judgment operation, and if there is even one FET in the erase incompletion state, repeating the erase operation and the hole drain operation until all FET's enter the erase completion state.

Since the hole drain operation is performed in succession after the erase operation, it is possible to effectively drain holes accumulated during the erase operation.

According to another aspect of the present invention, there is provided the semiconductor memory in which the control circuit executes: a step of performing the erase operation; a step of selecting each of the FET's subjected to the erase operation and performing the erase judgment operation, and if there is even one FET in the erase incompletion state, repeating the erase operation until all FET's enter the erase completion state; and a step of performing the hole drain operation if a judgment result by the erase judgment operation indicates that all FET's enter the erase completion state.

Since the hole drain operation is performed after all FET's enter the erase completion state, prolongation of the erase time to be caused by the hole drain operation can be suppressed.

According to another aspect of the present invention, there is provided the semiconductor memory in which the control circuit executes: a first step of sequentially selecting each FET from all FET's to be written and performing the write judgment operation for each selected FET, and if the selected FET is in the write incompletion state, performing the write operation for the selected FET; a second step of performing the hole drain operation; and a third step of repeating the first and second steps if there is even one FET in the write incompletion state.

Since the hole drain operation is performed in succession after the write operation, holes accumulated during the write operation can be efficiently drained.

According to another aspect of the present invention, there is provided the semiconductor memory in which the control circuit executes: a first step of performing the hole drain operation; a second step of sequentially selecting each FET from all FET's to be written and performing the write judgment operation for each selected FET, and if the selected FET is in the write incompletion state, performing the write operation for the selected FET; and a third step of repeating the second step if there is even one FET in the write incompletion state.

Since the hole drain operation is performed before the write operation, holes accumulated during the erase operation before the write operation can be efficiently drained.

According to another aspect of the present invention, there is provided the semiconductor memory in which the control circuit executes: a first step of sequentially selecting each FET from all FET's to be written and performing the write judgment operation for each selected FET, and if the selected FET is in the write incompletion state, performing the write operation for the selected FET; a second step of repeating the first step if there is even one FET in the write incompletion state; and a third step of performing the hole drain operation if all FET's to be written enter the write completion state.

Since the hole drain operation is performed after all FET's enter the write completion state, prolongation of the write time to be caused by the hole drain operation can be suppressed.

As above, by draining holes accumulated in the laminated gate insulating film, it becomes possible to prevent the write speed and erase speed from being lowered even if a rewrite operation is repeated.

BRIEF DESCRIPTION OF THE DRAWINGS

FIGS. 19A to 19H are cross sectional views of a substrate illustrating a method of manufacturing a SONOS type non-volatile memory of the second embodiment.

DETAILED DESCRIPTION OF THE PREFERRED EMBODIMENTS

Prior to giving the explanation of embodiments of the invention, problems associated with a conventional SONOS type non-volatile memory and found in experiments made by the present inventor will be described.

An FET constituting each memory cell of a SONOS type non-volatile memory has a gate insulating film of the three-layer structure of a silicon oxide film, a silicon nitride film and a silicon oxide film. In this specification, the silicon oxide film between a channel region and the silicon nitride film is called a substrate side insulating film, the silicon oxide film between the silicon nitride film and a gate electrode is called a gate side insulating film, and these three layers are called a laminated gate insulating film.

When data is to be written, for example, 0 V is applied to the source of FET of the selected memory cell and 6 V is applied to the drain. In this state, a pulse voltage of 10 V is applied to the gate electrode. Current flows through the channel and hot electrons are generated near the drain. Hot electrons move over the potential barrier of the substrate side insulating film and are trapped in the silicon nitride film near the drain. The threshold voltage of FET therefore shifts to the positive direction. This state is assumed to be "0". It is verified whether sufficient electrons are trapped in the data-written memory cell. If insufficient, the data write operation is again performed for this memory cell.

When data is to be erased, 6 V is applied to the sources and drains of a plurality of memory cells, and in this state, voltage pulses of −6 V are applied to the gate electrodes. Electrons trapped in the silicon nitride films are drained to the substrate and the threshold voltage shifts to the negative direction. This state is assumed to be "1". It is verified whether sufficient electron drainage was performed for all memory cells subjected to data erase. If insufficient, the data erase operation is again performed. A collection of a plurality of memory cells subjected to the erase operation at the same time is called a block.

In reading data, 1.4 V is applied to the drain of FET of a selected memory cell and 0 V is applied to the source. In this state, 4.0 V is applied to the gate electrode. In this case, the source and drain during the data write become the drain and source during the data read. In the memory cell subjected to data write, electrons were trapped in the silicon nitride film near the drain during the data write. By using the impurity diffusion region on the electron-trapped side as the source during the date read, it is possible to make large a shift amount of the threshold voltage. A magnitude of current flowing through the source and drain of the selected memory cell is compared with a reference current so that it is possible to judge whether the stored data is "0" or "1".

Figure 1:
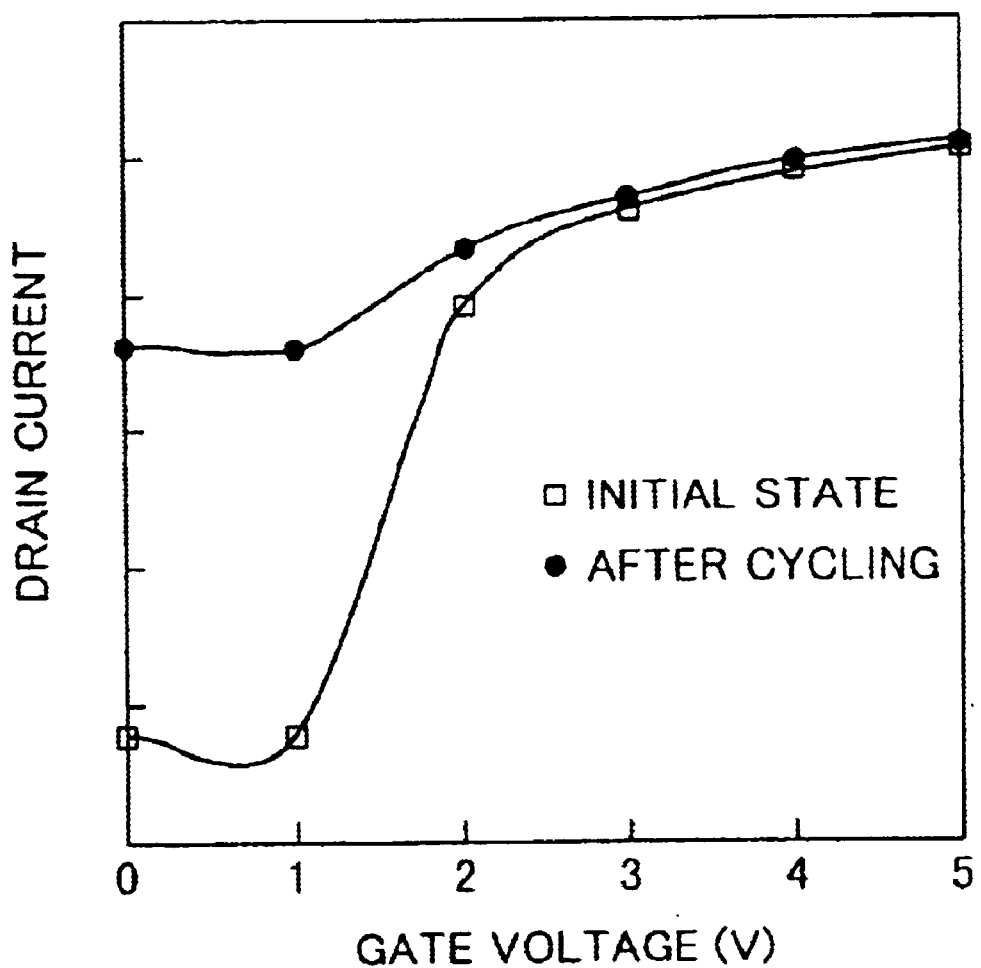
FIG. 1 is a graph showing current-voltage characteristics of a conventional SONOS type memory cell in an initial state and after cycling.

FIG. 1 shows an example of the current-voltage characteristics of a conventional SONOS type non-volatile memory. The abscissa represents a gate voltage in the unit of "V", and the ordinate represents a drain current in a logarithmic scale. Square symbols in FIG. 1 show the current-voltage characteristics in an initial state, and black circle symbols show the current-voltage characteristics after data write and data erase are performed a predetermined number of times (after a cycling operation).

In the initial state, when the gate voltage takes a certain threshold voltage or higher, the drain current abruptly increases so that the on-state and off-state of FET can be definitely distinguished. However, after the cycling operation, even at a gate voltage of 0 V, a large drain current (off-leak current) flows. It has been found that as the number of data write and erase operations is increased, the off-leak current also increases. It has also been found that the shorter the channel length of FET constituting a memory cell, an increase in the off-leak current becomes more distinctively.

The cases of an off-leak current increase will be explained. When data is to be erased, a high voltage, e.g., 6 V, is applied to the sources and drains of FET's constituting memory cells, and a ground potential of 0V is applied to the substrate. Therefore, a large reverse bias is applied to the pn junctions of the source and drain and an inter-band tunneling phenomenon occurs. As the inter-band tunneling phenomenon occurs, electron-hole pairs are generated. It can be considered that hot electrons generated during data write ionize silicon atoms near at the drain and generate holes.

Holes generated during the data write and erase are trapped in the substrate side insulating film of the laminated gate insulating film and in the interface between the substrate side insulating film and substrate. In the case of a SONOS type memory cell, it can be considered that many trap levels are formed at the interface between the substrate side insulating film and substrate, because of strains formed when the silicon oxide films and silicon nitride film were laminated and because of leaving hydrogen atoms when the gate side insulating film is formed by thermal oxidation. It can be considered that trapped holes induce a channel in a substrate surface layer and an effective channel length is shortened. One reason of an off-leak current increase may be ascribed to the shortened channel length.

Figure 2A:
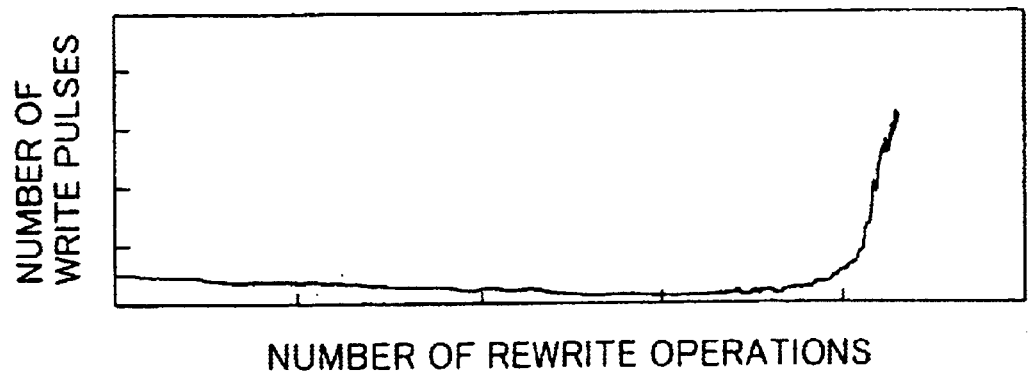
FIG. 2A is a graph showing a relation between the number of write pulses necessary for data write into a conventional SONOS type memory and the number of rewrite operations.

FIG. 2A shows the data write characteristics of a conventional SONOS type non-volatile memory. The abscissa represents the number of rewrite operations (one rewrite operation includes one data write and one data erase) in a logarithmic scale, and the ordinate represents the number of write pulses necessary for trapping sufficient electrons in an arbitrary unit. It can be understood from this graph that when the number of rewrite operations exceeds a certain number, the number of write pulses necessary for data write increases abruptly. An increase in the number of write pulses results in a reduction of a write speed. The causes of an abrupt increase in the number of write pulses will be described.

Figure 3:
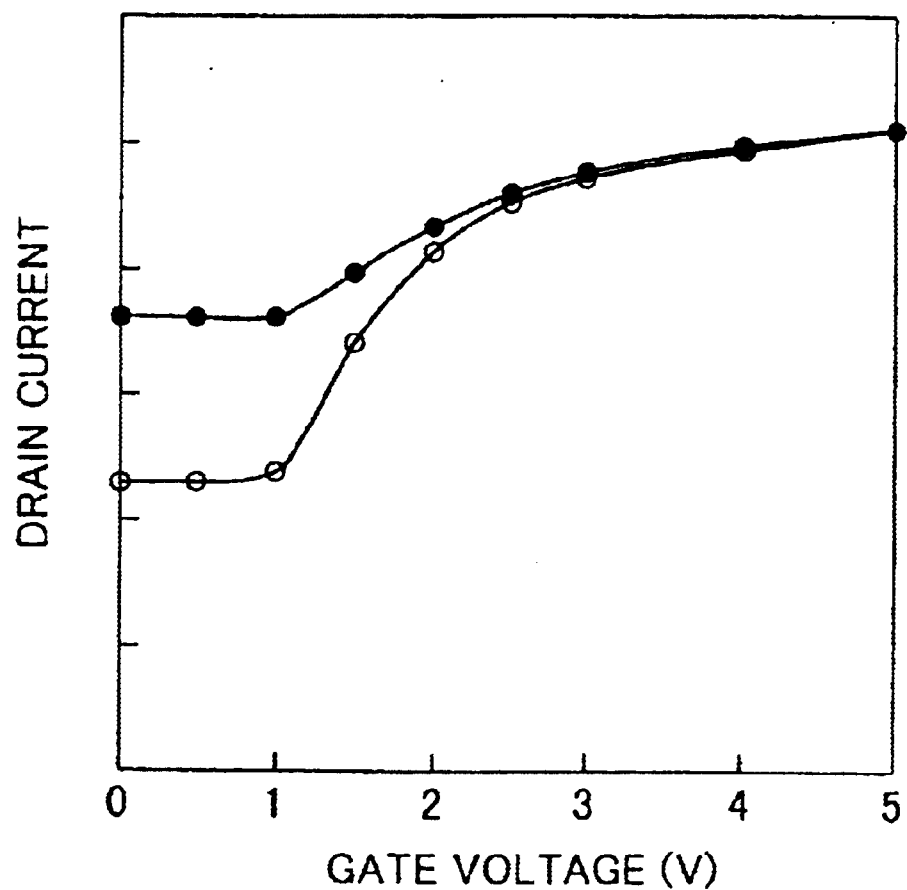
FIG. 3 is a graph showing current-voltage characteristics of a memory cell with a large reduction in a write speed and a memory cell with a relatively small reduction in a write speed, respectively after a certain number of rewrite operations are performed.

FIG. 3 shows the current-voltage characteristics of a memory cell after subjected to a certain number of rewrite operations. The abscissa represents a gate voltage in the unit of "V", and the ordinate represents a drain current in a logarithmic scale. Black circle symbols in FIG. 3 show the characteristics of a memory cell which showed a large reduction of the write speed, and white circle symbols show the characteristics of a memory cell which showed a relatively small reduction of the write speed. It can be seen from this graph that the memory cell with the large reduction of the write speed shows a distinct increase in the off-leak current. It can be considered that the write speed reduces because the off-peak current makes an insufficient rise of the drain voltage during data write.

Figure 2B:
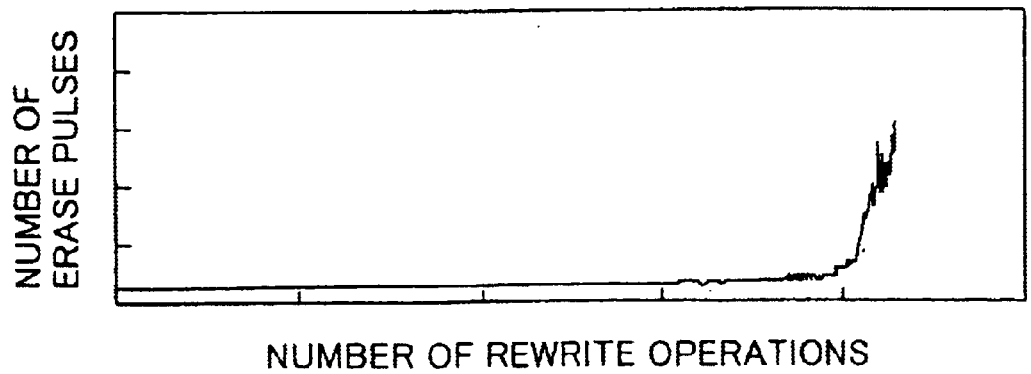
FIG. 2B is a graph showing a relation between the number of erase pulses necessary for data erase and the number of rewrite operations.

FIG. 2B shows the data erase characteristics of a conventional SONOS type non-volatile memory. The abscissa represents the number of rewrite operations in a logarithmic scale, and the ordinate represents the number of erase pulses necessary for draining sufficient electrons in an arbitrary unit. It can be seen from this graph that when the number of rewrite operations exceeds a certain number, the number of erase pulses increases abruptly. An increase of the number of erase pulses results in lowering the erase speed. Although the reason of lowering the erase speed is not definite, it has been found that if the write and erase operations are performed under the conditions that holes are generated more, the erase speed is lowered considerably. It can be considered from this that accumulation of holes in the laminated gate insulating film is one reason of lowering the erase speed.

Figure 4:
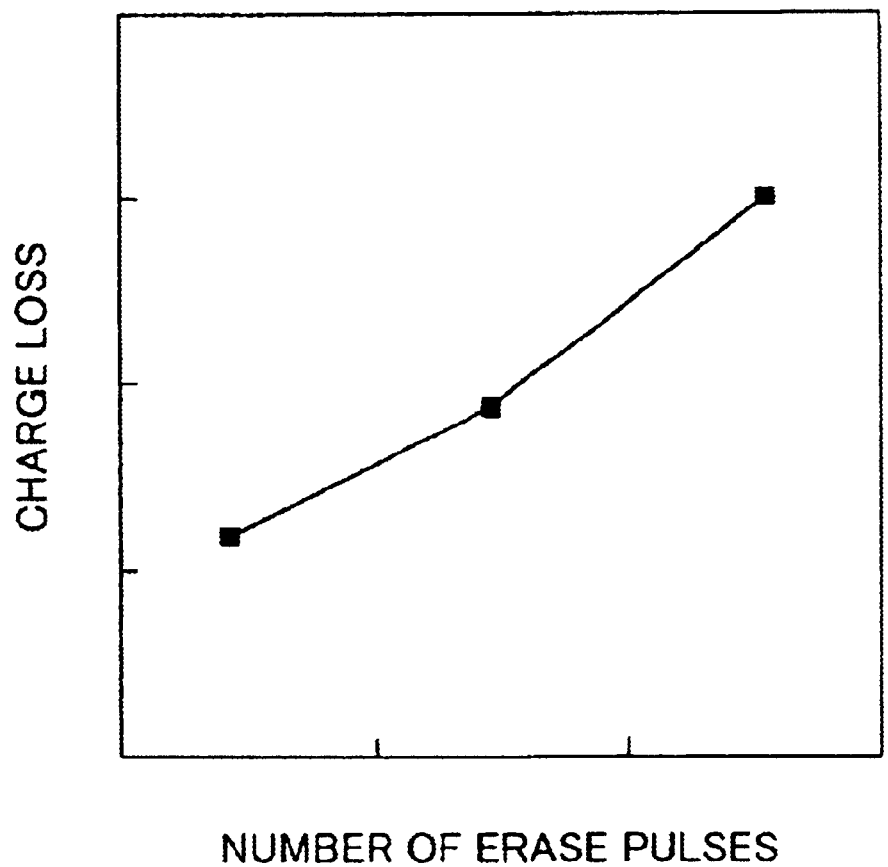
FIG. 4 is a graph showing a relation between a charge loss and the number of erase pulses of a SONOS type memory cell.

FIG. 4 shows a relation between the number of erase pulses and a charge loss. The abscissa represents the number of erase pulses in a logarithmic scale, and the ordinate represents a charge loss in an arbitrary unit. The charge loss was evaluated by measuring a lowered amount of the threshold voltage after a heat treatment is performed for 2 hours at 150° C. It can be seen that as the number of erase pulses increases, the charge loss increases. Namely, as the number of rewrite operations increases or the number of erase pulses necessary for date erase increases, not only the erase time is prolonged at shown in FIG. 2B but also the charge retention characteristics are also degraded.

In order to prevent prolongation of the write and erase times and deterioration of the charge retention characteristics, it is effective to suppress the generation of holes during the write and erase operations. Although it is possible to suppress the generation of holes by lowering the drain voltage during the write and erase operations, there arise other problems to be described with reference to FIGS. 5 and 6.

Figure 5:
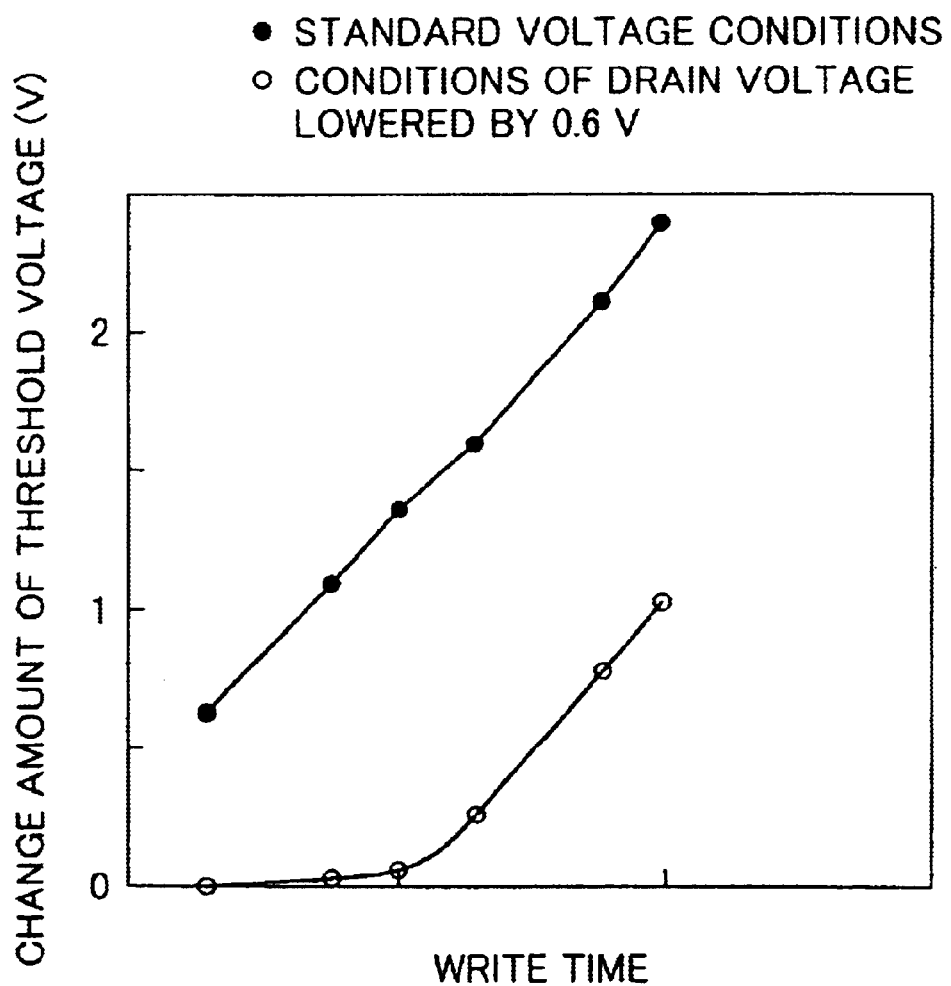
FIG. 5 is a graph showing a relation between a write time and a change in a threshold voltage under the standard voltage conditions and under the conditions of a lower drain voltage.

FIG. 5 is a graph showing a relation between a change amount of a threshold voltage and a write time. The abscissa represents a write time in a logarithmic scale, and the ordinate represents a change amount of a threshold voltage in the unit of "V". Black circle symbols shown in FIG. 5 show a change amount of the threshold voltage under the standard voltage conditions, i.e., a source voltage of 0 V, a drain voltage of 6 V and a gate voltage of 10 V. White circle symbols show a change amount of the threshold voltage when the drain voltage is lowered by 0.6 V from the standard voltage conditions and set to 5.4 V. As compared to the standard voltage conditions, as the drain voltage is lowered, the write time taken to provide the same change in the threshold voltage is prolonged.

Figure 6:
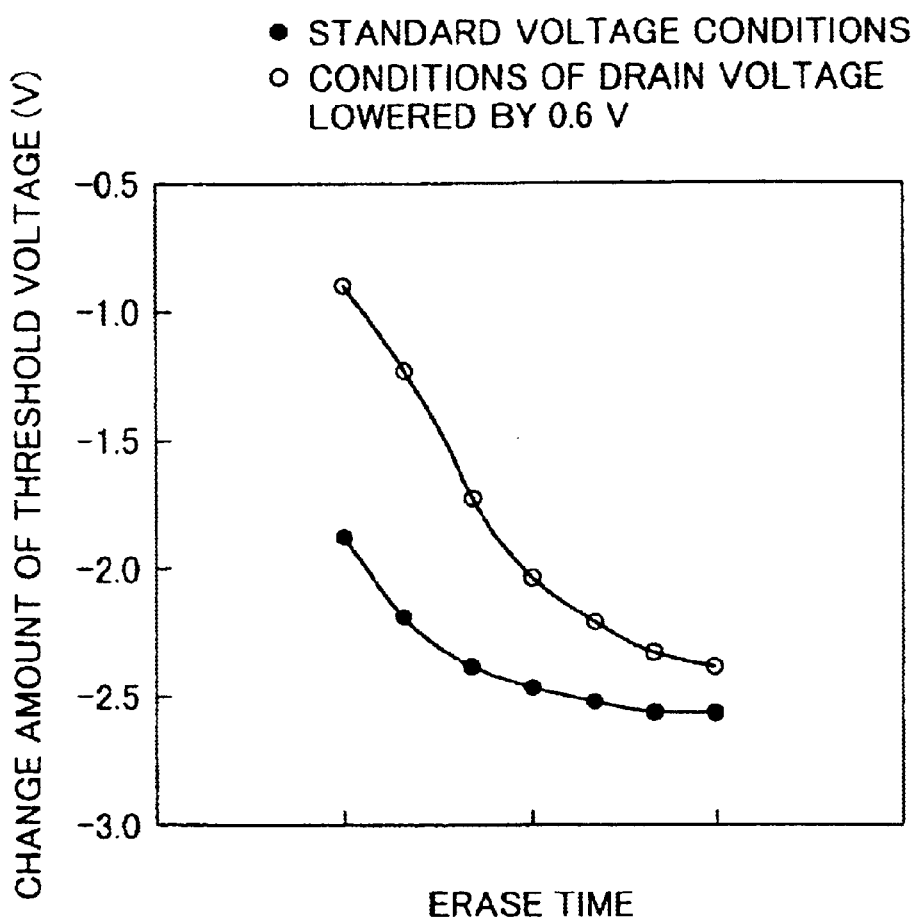
FIG. 6 is a graph showing a relation between an erase time and a change in a threshold voltage under the standard voltage conditions and under the conditions of a lower drain voltage.

FIG. 6 is a graph showing a relation between a change amount of a threshold voltage and an erase time. The abscissa represents an erase time in a logarithmic scale, and the ordinate represents a change amount of a threshold voltage in the unit of "V". Black circle symbols shown in FIG. 6 show a change amount of the threshold voltage under the standard voltage conditions, i.e., a source voltage of 6 V, a drain voltage of 6 V and a gate voltage of −6 V. White circle symbols show a change amount of the threshold voltage when the drain voltage is lowered by 0.6 V from the standard voltage conditions and set to 5.4 V. As compared to the standard voltage conditions, as the drain voltage is lowered, the erase time taken to provide the same change in the threshold voltage is prolonged.

Although it is conceivable that the lowered drain voltage during the write and erase operations presents the effects of suppressing the generation of holes, the write and erase times are prolonged as shown in FIGS. 5 and 6. Lowering the drain voltage is therefore unpractical.

In the embodiments to be described hereinafter, accumulation of holes in the laminated gate insulating film is suppressed so that even the number of rewrite operations increases, the write and erase times can be prevented from being prolonged. Embodiments of the invention will be described hereinunder.

Figure 7:
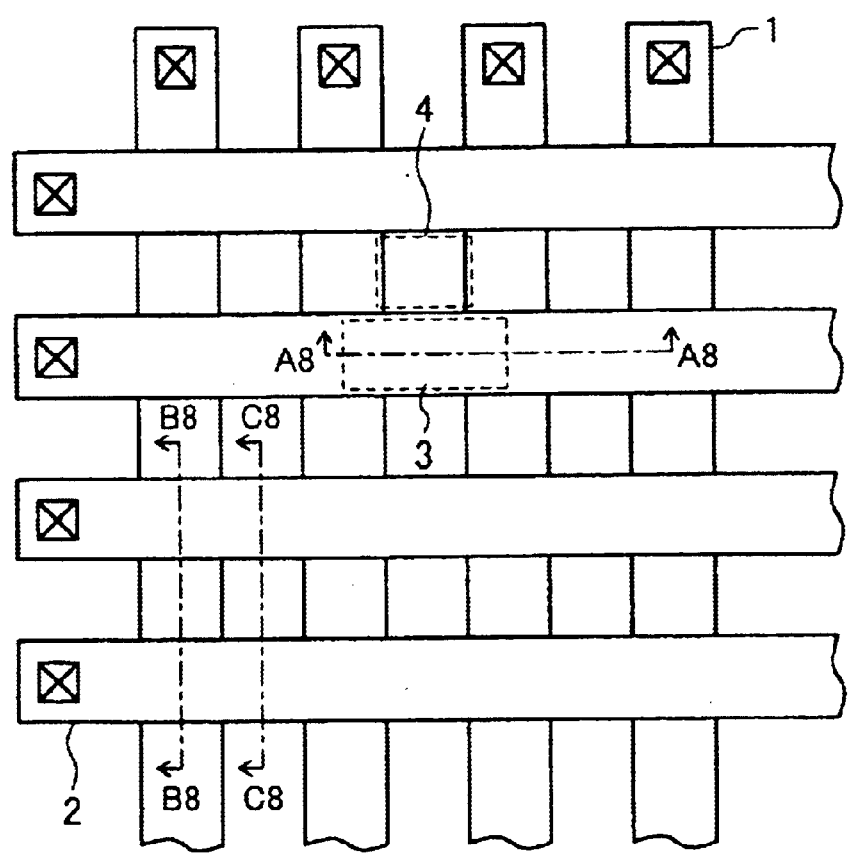
FIG. 7 is a schematic plan view of a SONOS type non-volatile memory according to a first embodiment of the invention.

FIG. 7 is a schematic plan view of a SONOS type non-volatile memory according to a first embodiment of the invention. On the surface of a p-type silicon substrate, a plurality of bit lines 1 are disposed in parallel. The bit line 1 is made of an impurity diffusion region doped with n-type impurities and formed on a surface layer of the silicon substrate. A plurality of word lines 2 extend along a direction crossing the bit lines 1. The word line 2 is electrically insulated from the bit line 1 in the cross area therebetween.

An FET 3 is disposed in each cross area between a stripe region between a pair of adjacent bit lines 1 and one word line 2. Two bit lines 1 are used also as the source and drain of FET 3. The word line 2 is used also as the gate electrode of FET 3. A channel stopper region 4 doped with p-type impurities is formed between channel regions of two adjacent FET's 3 extending along the direction of the bit line 1.

Figure 8A:
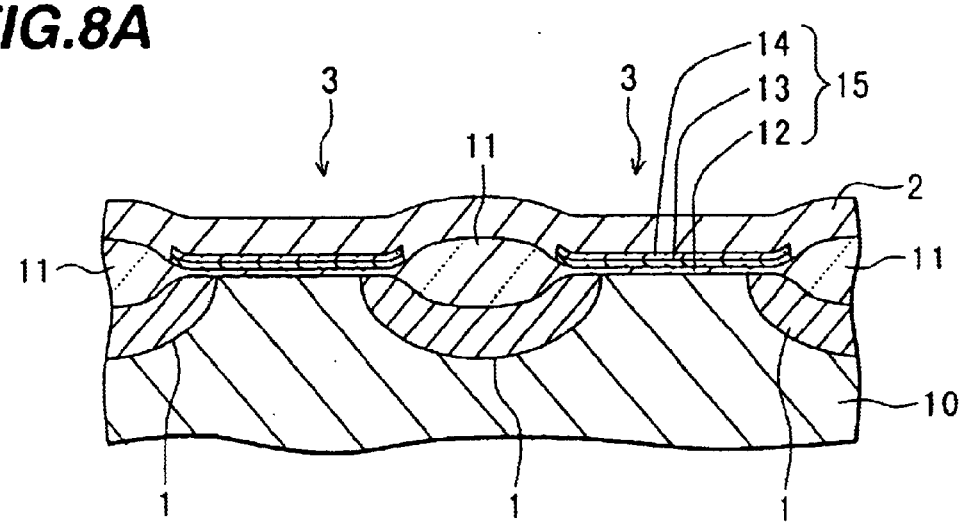
FIGS. 8A to 8C are cross sectional views of the SONOS type non-volatile memory shown in FIG. 7.
Figure 8B:
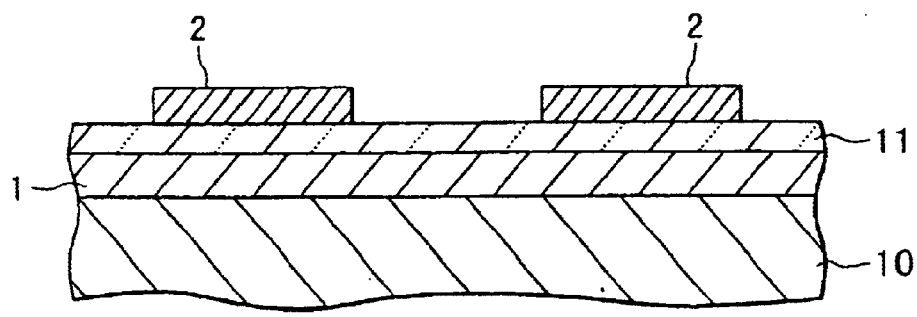
Figure 8C:
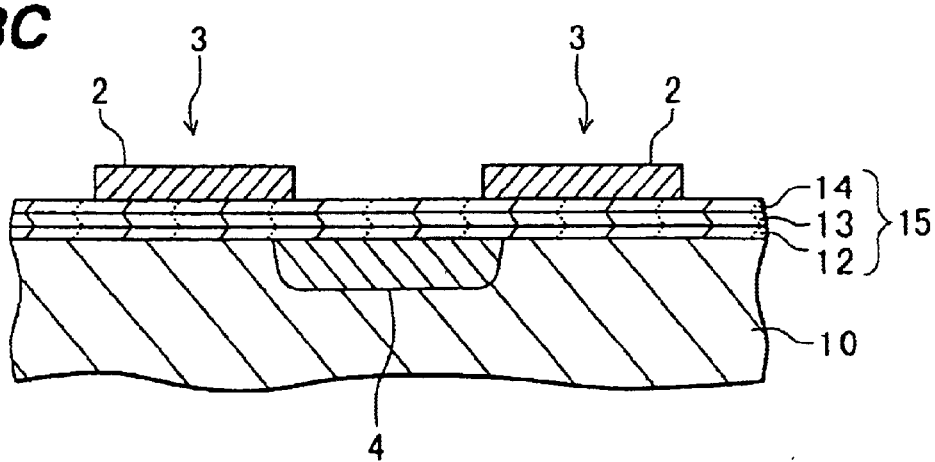

FIGS. 8A to 8C are cross sectional views taken along on-dot chain lines A8—A8, B8—B8 and C8—C8 shown in FIG. 7, respectively.

As shown in FIG. 8A, a local insulating film 11 formed on the surface of the p-type silicon substrate 10 defines active regions. The local insulating film 11 extends along a direction perpendicular to the drawing sheet of FIG. 8A. A laminated gate insulating film 15 is formed on the active region. The laminated gate insulating film 15 has a three-layer structure of a substrate side insulating film 12 made of silicon oxide, a charge trap film 13 made of silicon nitride, and a gate side insulating film 14 made of silicon oxide, respectively stacked in this order from the substrate side.

The bit line 1 constituting the impurity diffusion region doped with arsenic (As) is formed in the substrate surface layer under the local insulating film 11. The word line 2 extending along a lateral direction in FIG. 8A is formed on the local insulating film 11 and laminated gate insulating film 15. The word line 2 has a lamination structure of, for example, a polysilicon layer and a tungsten silicide (WSi) layer. The bit line 1 and word line 2 are electrically insulated by the local insulating film 11 in the cross area therebetween. FET 3 is formed in each cross area between the stripe region between a pair of adjacent bit lines 1 and one word line 2. FET 3 uses a pair of bit lines 1 also as the source and drain, and the word line 2 also as the gate electrode.

In the cross sectional view shown in FIG. 8B, the bit line 1 and local insulating film 11 extend along a lateral direction of FIG. 8B. The word line 2 extending along a direction perpendicular to the drawing sheet of FIG. 8B is disposed on the local insulating film.

In the cross sectional view shown in FIG. 8C, the channel stopper region 4 doped with boron (B) is formed in the substrate surface layer between the channel stopper regions of adjacent two FET's 3.

Next, a method of manufacturing the SONOS type non-volatile memory of the first embodiment shown in FIGS. 8A to 8C will be described.

First, on the surface of a p-type silicon substrate 10, a silicon oxide film of 7 nm in thickness is formed by wet oxidation. On the silicon oxide film, a silicon nitride film is deposited to a thickness of 15 nm by chemical vapor deposition (CVD). A surface layer of the silicon nitride film is wet-oxidized by 10 nm in thickness to form a silicon oxide film. With this wet oxidation, a silicon nitride of 5 nm thickness is left.

An area between any two bit lines 1 adjacent to each other shown in FIG. 7 is covered with a resist pattern, and the uppermost silicon oxide film and underlying silicon nitride film are etched. For this etching, dry etching using $CF_4$, $CHF_3$ and $O_2$ is used. The lowermost silicon oxide film functions as a through oxide film at a later ion implantation process. With this etching, the gate side insulating film 14 and charge trap film 13 shown in FIG. 8A are left.

By using the resist pattern as a mask, arsenic (As) ions are implanted into the surface layer of the silicon substrate 10 at an acceleration energy of 50 to 80 keV, a dose of $2\times10^{15}$ to $5\times10^{15} cm^{-2}$, and an incidence angle of the ion beam of nearly 0°. With As ion implantation, the bit line 1 shown in FIGS. 8A and 8B is formed.

In order to prevent a punch-through phenomenon, boron ions are implanted into opposite regions of the As doped region by using the resist pattern as a mask. For example, boron ions are implanted at acceleration energy of 50 to 70 keV, a dose of $5\times10^{12}$ to $2\times10^{13} cm^{-2}$ and an incidence angle of 20 to 30°. The inclination direction of the ion beam is a direction perpendicular to the bit line 1 shown in FIG. 7. The ion beam is radiated along two opposing directions.

After the resist pattern is removed, by using the charge trap film 13 made of silicon nitride as a mask, the surface of the silicon substrate 10 is locally oxidized. With this local oxidation, the local insulating film 11 shown in FIGS. 8A and 8B is formed which has a thickness of 50 nm.

A conductive film of 100 to 150 nm in thickness is formed by CVD, covering the whole surface of the substrate, the conductive film having the lamination structure of a polysilicon layer and a WSi layer. An area where the word line 2 shown in FIG. 1 is covered with a resist pattern. By using this resist pattern as a mask, the conductive film having the lamination structure of the polysilicon layer and WSi layer is etched. The conductive film left after this etching becomes the word line 2. After the etching, the resist pattern is removed.

By using the word line 2 as a mask, boron ions are implanted into the substrate surface layer at acceleration energy of 50 to 80 keV and a dose of $3\times10^{12}$ to $1\times10^{13} cm^{-2}$. With this ion implantation, the channel stopper region 4 shown in FIG. 8C is formed. Although boron ions are also implanted into the substrate surface layer between adjacent two word lines 2 shown in FIG. 8B, the dose of boron ions is negligible as compared to the As concentration of the bit line 1.

Figure 9:
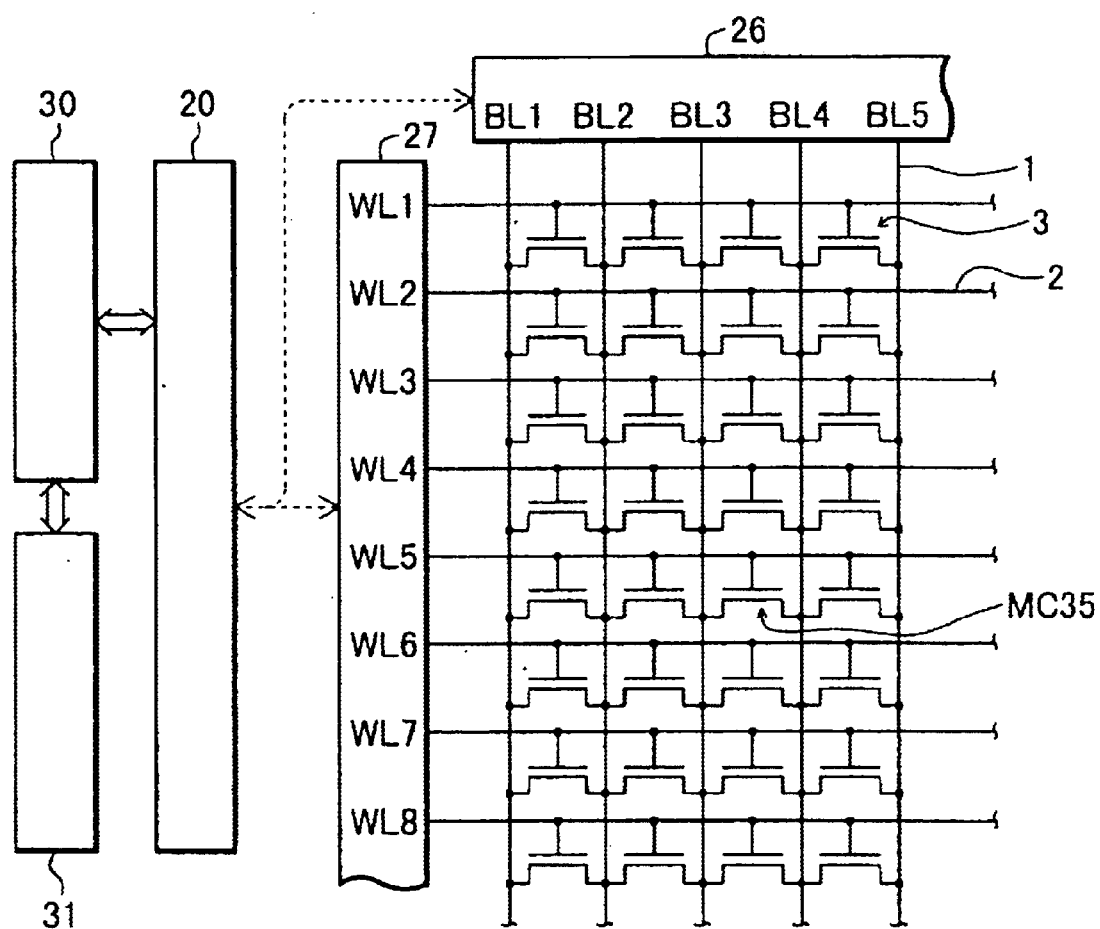
FIG. 9 is a block diagram of the SONOS type non-volatile memory shown in FIG. 7, a partial area being shown by an equivalent circuit.

FIG. 9 is a functional block diagram of the SONOS type non-volatile memory of the first embodiment, a portion thereof being shown by an equivalent circuit. The source and drain of FET 3 constituting one memory cell are connected to adjacent two bit lines 1 and the gate electrode is connected to the word line 2.

A plurality of memory cells are disposed in a matrix shape to form a memory cell array. Each memory cell is assigned an address and identified by this address information. The memory cell array is divided into a plurality of blocks, and each memory cell belongs to one of these blocks.

The bit lines are connected to a sense amplifier 26, and the word lines 2 are connected to a word line driver 27. A control circuit 20 controls the sense amplifier 26 and word line driver 27. The bit lines 1 are represented by symbols BL1, BL2, BL3, BL4, . . . sequentially from the left side in FIG. 9. The word lines 2 are represented by symbols WL1, WL2, WL3, WL4, . . . sequentially from the upper side in FIG. 9. For example, a memory cell connected to the bit lines BL3 and BL4 and the word line WL5 is represented by a symbol MC35. The control circuit 20 has an address counter. A desired memory cell can be accessed by selecting the bit lines and word line connected to the memory cell identified by address information set to the address counter.

The control circuit 20 is controlled by an external CPU 30. A RAM 31 is connected to CPU 30. RAM 31 temporarily stores data to be written in the SONOS type non-volatile memory.

Next, the read, erase, write, and hole drain operations of the SONOS type non-volatile memory shown in FIG. 9 will be described. The operations to follow are executed by the control circuit 20 in response to commands from CPU 30. In any of the operations, the silicon substrate 10 is being grounded.

First, the erase operation will be described. A block whose data is to be erased is designated from CPU 30 to the control circuit 20. A voltage of 6.0 V is applied to all the bit lines 1 in the selected block. Next, a pulse voltage of −6.0 V is applied for 10 ms to all the word lines 2 in the selected block. With this erase stress, in all the memory cells in the selected block, electrons are drained from the charge trap films 13 shown in FIG. 8A. The threshold voltage is therefore shifted to the low voltage side. In an actual case, as will be later described, the pulse voltage is repetitively applied to the word lines 2 until trapped electrons are sufficiently drained.

Next, the write operation will be described by taking as an example writing data in the memory cell MC35. A memory cell to be written is designated from CPU 30. A voltage of 6.0 V is applied to the bit line BL3 and a voltage of 0 V is applied to the bit line BL4. Namely, the region connected to the bit line BL4 becomes the source and the region connected to the bit line BL3 becomes the drain. The other bit lines are made in a floating state.

A voltage of 0V is applied to all the word lines and a pulse voltage of 10 V is applied to the word line WL5 for 10 μs. With this write stress, electrons are injected into the charge trap film 13 near the drain of the memory cell MC35. With this electron injection, the threshold voltage shifts to the high voltage side. In an actual case, as will be later described, the pulse voltage is repetitively applied to the word line WL5 until sufficient electrons are trapped.

Next, the read operation will be described by taking as an example reading data stored in the memory cell MC35. A memory cell from which data is read is designated from CPU 30. A voltage of 0 V is applied to the bit line BL3 and a voltage of 1.4 V is applied to the bit line BL4. Namely, the region connected to the bit line BL3 becomes the source and the region connected to the bit line BL4 becomes the drain. This correspondence is opposite to that during the write operation. The other bit lines are made in a floating state.

A voltage of 4.0 V is applied to the word line WL5, whereas a voltage of 0 V is applied to the other word lines. The sense amplifier 26 detects a current flowing between the bit lines BL3 and BL4. The detected current is compared with a reference current. If electrons are being trapped in the charge trap film 13 of the memory cell MC35, the current smaller than the reference current flows and the stored data is judged as "0". If electrons are not being trapped in the charge trap film 13 of the memory cell MC35, the current equal to or larger than the reference current flows and the stored data is judged as "1".

In this write operation, if the voltages applied to the bit lines BL3 and BL4 are exchanged, the region connected to the bit line BL4 becomes the drain. In this case, electrons are injected into the charge trap film near the bit line BL4. In this manner, it is possible to trap electrons independently into the charge trap film either in the region near the bit line BL3 or in the region near the bit line BL4.

Also in the read operation, if the voltages applied to the bit lines BL3 and BL4 are exchanged, a trap state of electrons in the charge trap film near the bit line BL4 can be detected. From the above reasons, information of two bits can be stored in one memory cell.

Next, the hole drain operation will be described. A block to be subjected to the hole drain operation is designated from CPU 30. Bit lines 1 of all the memory cells in the block to be subjected to the hole drain operation are grounded. Word lines of all the memory cells in the selected block are applied with a voltage of 10 V for about 100 ms. With this hole drain operation, holes are drained which were accumulated in the laminated gate insulating film or at the interfaces between these films constituting the laminated structure.

Next, an erase judgment operation and a write judgment operation will be described. The erase judgment and write judgment operations are realized by changing the voltage to be applied to the word line 2 during the read operation. A voltage of 4.0 V is applied to the selected word line 2 during the read operation, whereas a voltage of 2.5 V is applied during the erase judgment operation and a voltage of 4.5 V is applied during a write judgment operation.

In the erase judgment operation, if a current flowing between two bit lines connected to a selected memory cell is equal to or larger than the reference current, it is judged that data erase of the memory cell is completed, whereas if it is smaller than the reference current, it is judged that data erase of the memory cell is not completed. In the write judgment operation, if a current flowing between two bit lines connected to a selected memory cell is smaller than the reference current, it is judged that data write of the memory cell is completed, whereas if it is equal to or larger than the reference current, it is judged that data write of the memory cell is not completed.

Next, with reference to FIG. 10, a first driving method for the SONOS type non-volatile memory of the first embodiment will be described. In this first driving method, the erase operation and hole drain operation are executed in succession.

Figure 10:
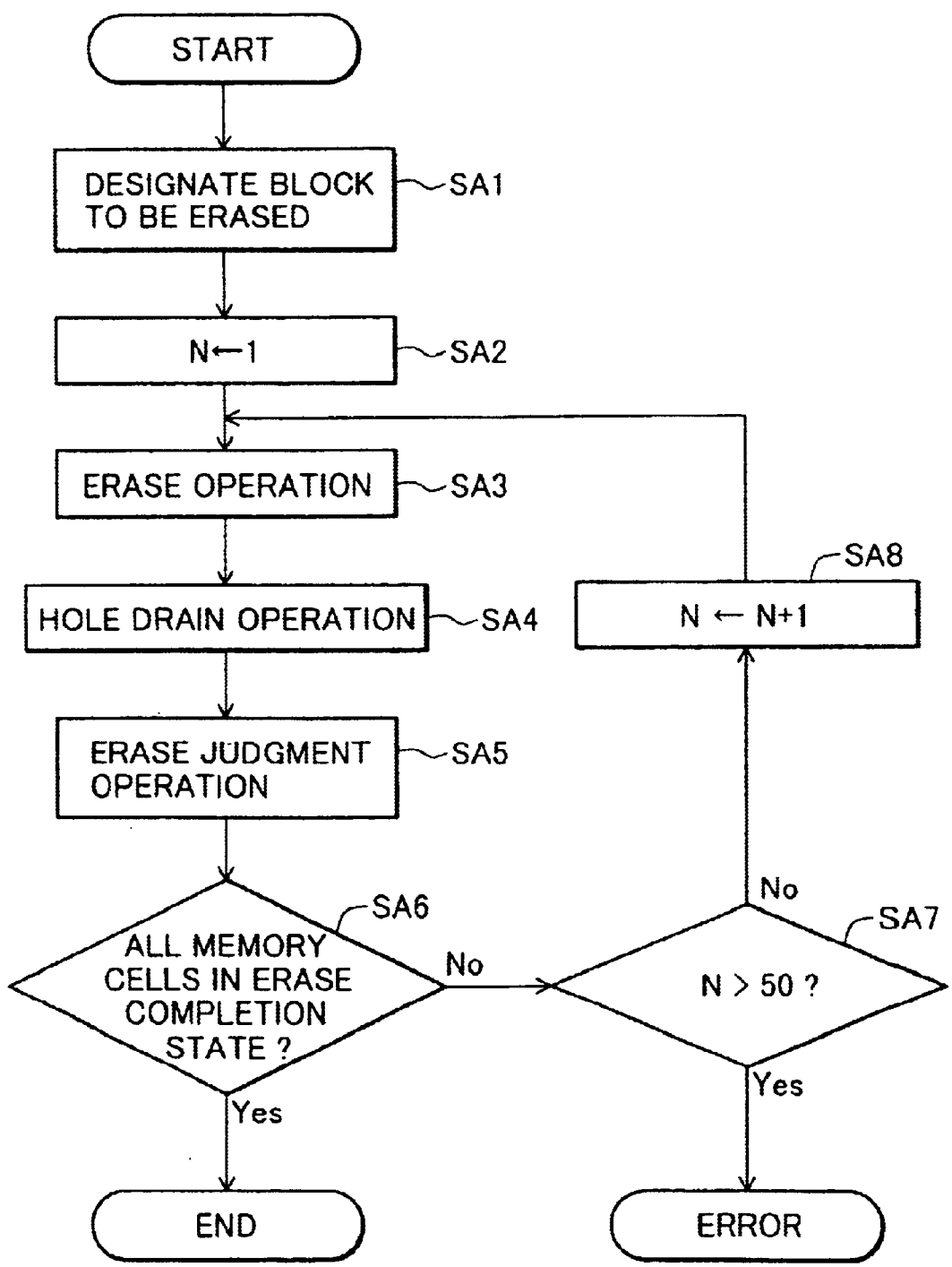
FIG. 10 is a flow chart illustrating a first driving method.

FIG. 10 is a flow chart illustrating the first driving method. At Step SA1, information of identifying the block whose data is to be erased is supplied from CPU 30 to the control circuit 20 shown in FIG. 9. At the next Step SA2, 1 is substituted into a variable N. The variable N is used for memorizing the number of erase operations.

At the next Step SA3, all memory cells in the block to be erased are collectively subjected to the erase operation. At the next Step SA4, all memory cells in the block to be erased are collectively subjected to the hole drain operation. At the next Step SA5, each memory cell subjected to the erase operation is subjected to the erase judgment operation. At the next Step SA6, it is checked whether all the memory cells in the block to be erased are in an erase completion state.

If all the memory cells are in the erase completion state, the erase operation is terminated. If there is even one memory cell in an erase incompletion state, the flow advances to Step SA7 whereat it is checked whether the variable N is larger than 50. If larger, an error process is performed. If the variable N is equal to or smaller than 50, the variable is incremented by 1 at Step SA8 to thereafter return to Step SA3.

Figure 11A:
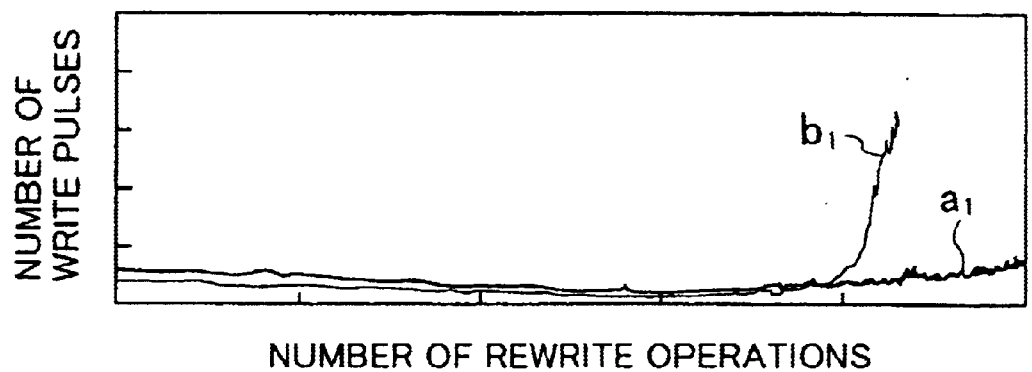
FIG. 11A is a graph showing a relation between the number of write pulses necessary for data write and the number of rewrite operations, when the first driving method is used.

FIG. 11A is a graph showing the write characteristics when data is rewritten in a SONOS type non-volatile memory by using the first driving method, compared with the write characteristics when data is written by using a conventional driving method which does not perform the hole drain operation. The abscissa represents the number of rewrite operations in a logarithmic scale, and the ordinate represents the number of write pulses necessary for trapping sufficient electrons in an arbitrary unit. A solid line $a_1$ shows the write characteristics when the first driving method is used, and a solid line $b_1$ shows the write characteristics when a conventional driving method is used. The solid line $b_1$ is the same as the write characteristics shown in FIG. 2A. By using the first driving method, the number of write pulses hardly increases even if the number of rewrite operations increases.

Figure 12:
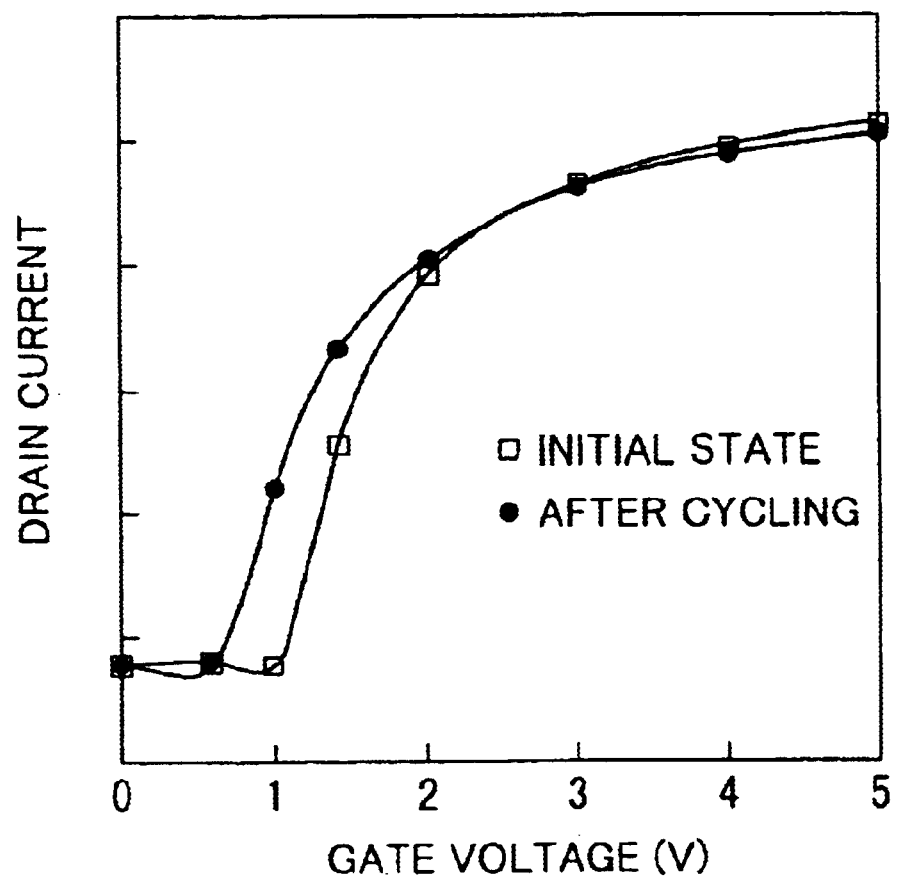
FIG. 12 is a graph showing current-voltage characteristics in an initial state and after cycling, when the first driving method is used.

FIG. 12 is a graph showing the current-voltage characteristics of a memory cell before a rewrite operation and after the certain number of rewrite operations. The abscissa represents a gate voltage in the unit of "V", and the ordinate represents a drain current in a logarithmic scale. White square symbols show in FIG. 12 show the characteristics of a memory cell in an initial state, and black circle symbols show the characteristics of the memory cell after the certain number of rewrite operations by using the first driving method. Even after the certain number of rewrite operations, an increase of the off-leak current is not observed and it can be understood that the on-state and off-state of the memory cell can be distinguished clearly. It can be considered that the write speed can be prevented from being lowered because an increase of the off-leak current can be prevented by using the first driving method.

Figure 11B:
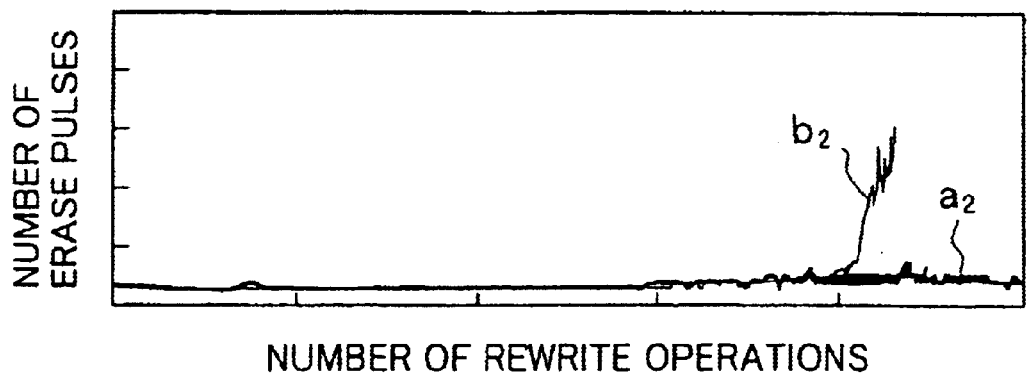
FIG. 11B is a graph showing a relation between the number of erase pulses necessary for data erase, respectively when the first driving method is used.

FIG. 11B is a graph showing the erase characteristics when data is rewritten in a SONOS type non-volatile memory by using the first driving method, compared with the erase characteristics when data is written by using a conventional driving method which does not perform the hole drain operation. The abscissa represents the number of rewrite operations in a logarithmic scale, and the ordinate represents the number of erase pulses necessary for draining sufficient electrons in an arbitrary unit. A solid line $a_2$ shows the erase characteristics when the first driving method is used, and a solid line $b_2$ shows the write characteristics when a conventional driving method is used. The solid line $b_2$ is the same as the erase characteristics shown in FIG. 2B.

It can be understood that by adopting the first driving method, an increase of the number of erase pulses is suppressed and the erase speed can be prevented from being lowered. This may be ascribed to that the hole drain operation drains holes accumulated in the laminated gate insulating film 15 shown in FIG. 8A.

In the SONOS type non-volatile memory, holes are easy to be generated by the inter-band tunneling phenomenon because a high voltage is applied to the pn junctions of the source and drain of FET of a memory cell during the erase operation. In the case that many holes are generated during the erase operation, it is preferable to perform the hole drain operation immediately after the erase operation as in the case of the first driving method. It is therefore possible to prevent the accumulation of holes by repeating the hole drain operation.

Next, with reference to FIG. 13, proper voltages to be applied during the hole drain operation will be described. For the first driving method, a voltage of 0 V is applied to the bit line during the hole drain operation and a voltage of 10 V is applied to the word line. By lowering the voltage to be applied to the word line, holes accumulated in the laminated gate insulating film become difficult to be drained.

If the voltage to be applied to the word line is raised, the hole drain effects can be enhanced. However, if the word line voltage is made too high, electrons are injected from the substrate into the charge trap film by the Fowler-Nordheim tunneling phenomenon.

Figure 13:
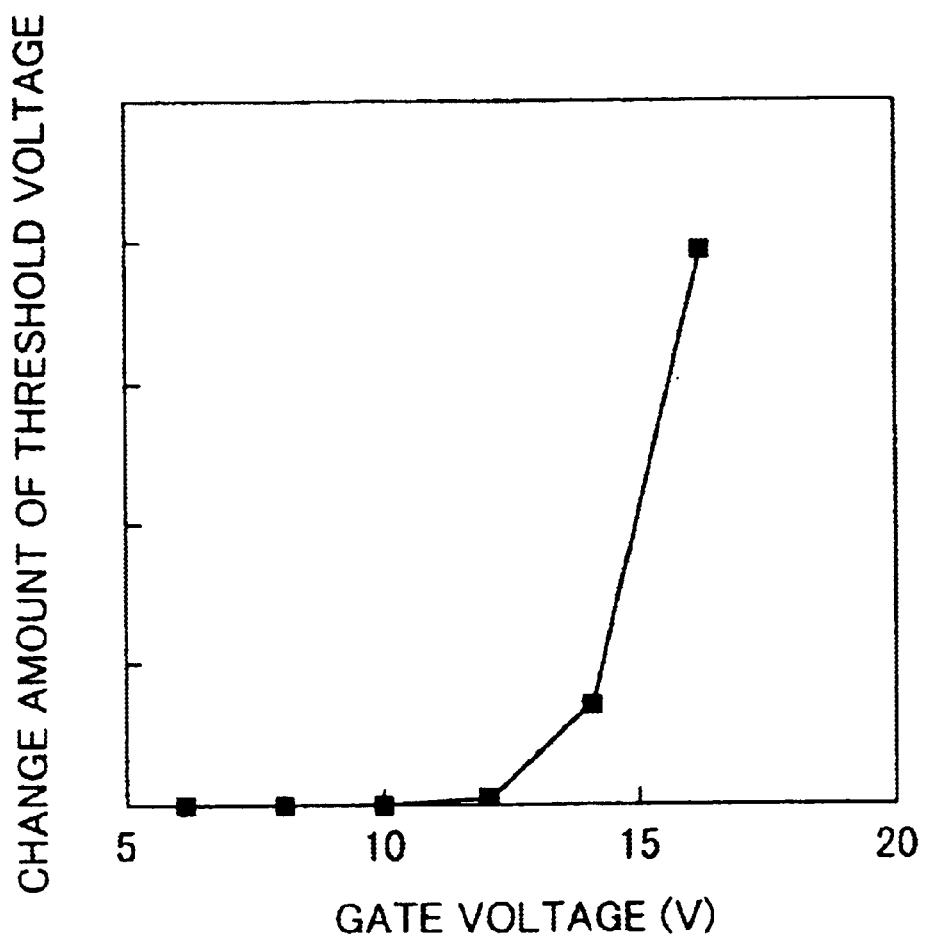
FIG. 13 is a graph showing a relation between a gate voltage and a change in a threshold voltage when the source and drain of a SONOS type memory cell are grounded.

FIG. 13 shows a change amount of a threshold voltage when a gate voltage having a time width of 100 ms is applied to the gate electrode (word line 2) under the conditions that the source and drain (bit line 1) of FET of a memory cell of the SONOS type non-volatile memory of the first embodiment and the substrate 10 are grounded. The abscissa represents a gate voltage in the unit of "V", and the ordinate represents a change amount of a threshold voltage in an arbitrary unit.

As seen from this graph, as the gate voltage exceeds 14 V, a change amount of the threshold voltage abruptly increases. The reason for this may be ascribed to that electrons are injected from the substrate into the charge trap film by the Fowler-Nordheim tunneling phenomenon. If the threshold voltage is changed greatly by the hole drain operation, data stored in a memory cell will be lost. It is therefore preferable that a difference between a voltage applied to the source, drain and substrate and a voltage applied to the gate electrode during the hole drain operation is set approximately to such a value that electrons are not injected into the charge trap film by the Fowler-Nordheim tunneling phenomenon.

As shown in FIG. 13, the hole drain operation at the gate electrode voltage of 12 V or lower can drain holes accumulated in the laminated gate insulating film without changing the memory cell characteristics. It is therefore possible to perform the hole drain operation collectively for a plurality of memory cells, instead of performing it sequentially one memory cell after another. In this manner, holes can be drained easily. The phenomenon that holes can be drained at a voltage equal to or lower than the voltage at which the Fowler-Nordheim phenomenon occurs, has been found first by the present inventor through experiments.

Next, with reference to FIG. 14, a second driving method for the SONOS type non-volatile memory of the first embodiment will be described.

Figure 14:
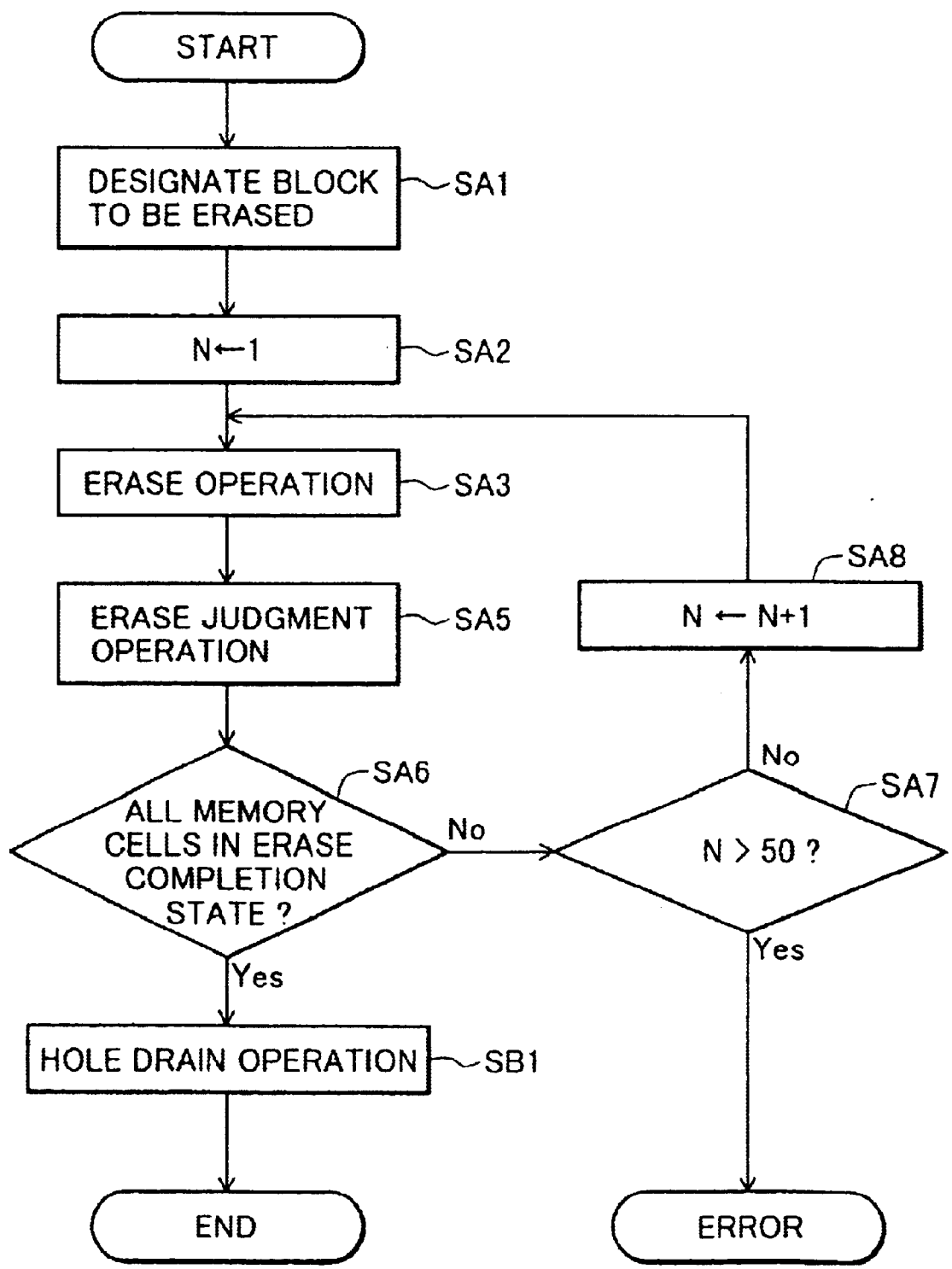
FIG. 14 is a flow chart illustrating a second driving method.

FIG. 14 is a flow chart illustrating the second driving method. The first driving method performs the hole drain operation immediately after the erase operation at Step SA3 as shown in FIG. 10. In contract, according to the second driving method, after the erase operation at Step SA3, the flow advances to Step SA5 whereat the erase judgment operation is performed without performing the hole drain process. After it is confirmed at Step SA6 that all memory cells are in the erase completion state, the hole drain operation is performed once at Step SB1.

It is expected that it is sufficient to perform the hole drain operation once after the erase operation is completed as in the second driving method, if an amount of holes is small at the completion of the erase operation, the hole amount depending on the structure of a memory cell, a voltage condition during the erase operation and the like.

Next, with reference to FIG. 15, a third driving method will be described. In the first and second driving methods, the hole drain operation is performed in connection with the erase operation, whereas in the third driving operation, the hole drain operation is performed in connection with the write operation.

Figure 15:
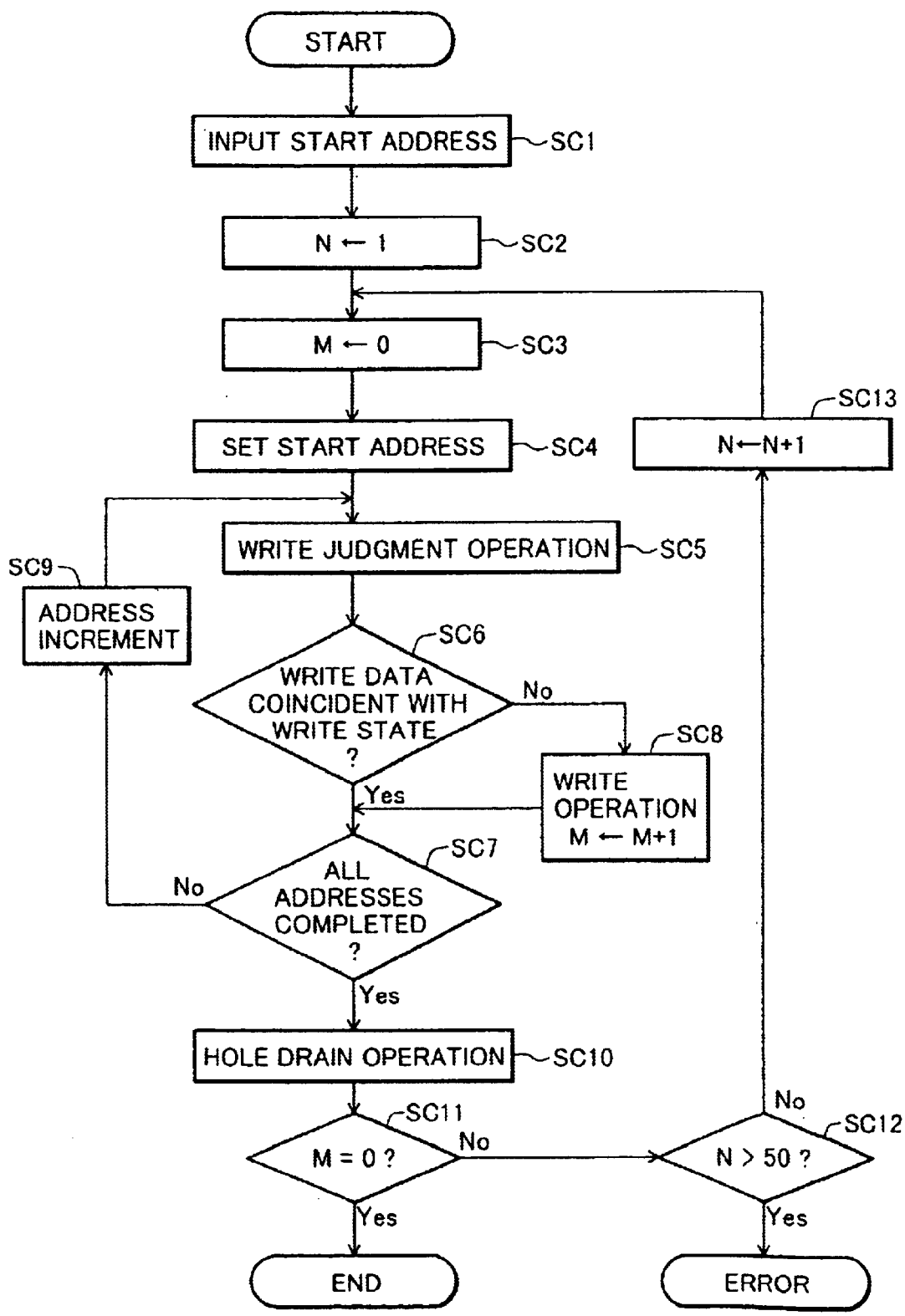
FIG. 15 is a flow chart illustrating a third driving method.

FIG. 15 is a flow chart illustrating the third driving method. At Step SC1, CPU 30 shown in FIG. 9 supplies the control circuit 20 with the start and end addresses of start and end memory cells among a plurality of memory cells in which data is written. Data to be written is temporarily stored in RAM 31 at predetermined addresses.

At the next Step SC2, 1 is substituted into a variable N. The variable N memorizes the number of write operations of one memory cell among a plurality of memory cells to be written which memory cell has the largest number of write operations. At the next Step SC3, 0 is substituted into a variable M. The variable M is used as an index for judging whether all memory cells are in the write completion state.

At the next Step SC4, the start address is set to the address counter in the control circuit 20 shown in FIG. 1. At the next Step SC5 the write judgment operation is performed for the memory cell at the address set to the address counter. The initial states of all memory cells are in a write incompletion state. At the next Step SC6, it is checked whether the data to be written is coincident with the write state. The data to be written is supplied from RAM 31 via CPU 30 shown in FIG. 9. If the data to be written is "0" and the write state is the write incompletion state, Step SC8 is executed and thereafter the flow advances to Step SC7. If the data to be written is "0" and the write state is a write completion state, the flow directly advances to Step SC7. If the data to be written is "1", the flow directly advances to Step SC7 because the data to be written is coincide with the write state.

At Step SC8 the write operation is performed for the memory cell identified by the address set to the address counter, and the variable M is incremented by 1.

At Step SC7 the end address of the memory cell to be written is compared with the address set to the address counter. If the address set to the address counter is smaller than the end address, i.e., if there is a memory cell whose write state is to be verified, the flow advances to Step SC9 whereat the address counter is incremented by 1 to thereafter return to Step SC5. If the address set to the address counter is coincident with the end address, i.e., if the verification of the write states of all memory cells is completed, the flow advances to Step SC10.

At Step SC10, the hole drain operation is performed for all memory cells at the start address to end address. At the next Step SC11, it is checked whether or not the variable M is 0. If the variable M is 0, i.e., if all memory cells in which data "0" was written are in the write completion state, then the write operation is terminated, whereas if the variable M is not 0, the flow advances to Step SC12.

At Step SC12 it is checked whether the variable N is 50 or smaller. If larger than 50, the flow enters an error process. If the variable is 50 or smaller, the variable N is incremented by 1 at Step SC13 to thereafter return to Step SC3.

The third driving method is particularly effective for the case that many holes are likely to be generated during the write operation.

Next, with reference to FIG. 16, a fourth driving method will be described.

Figure 16:
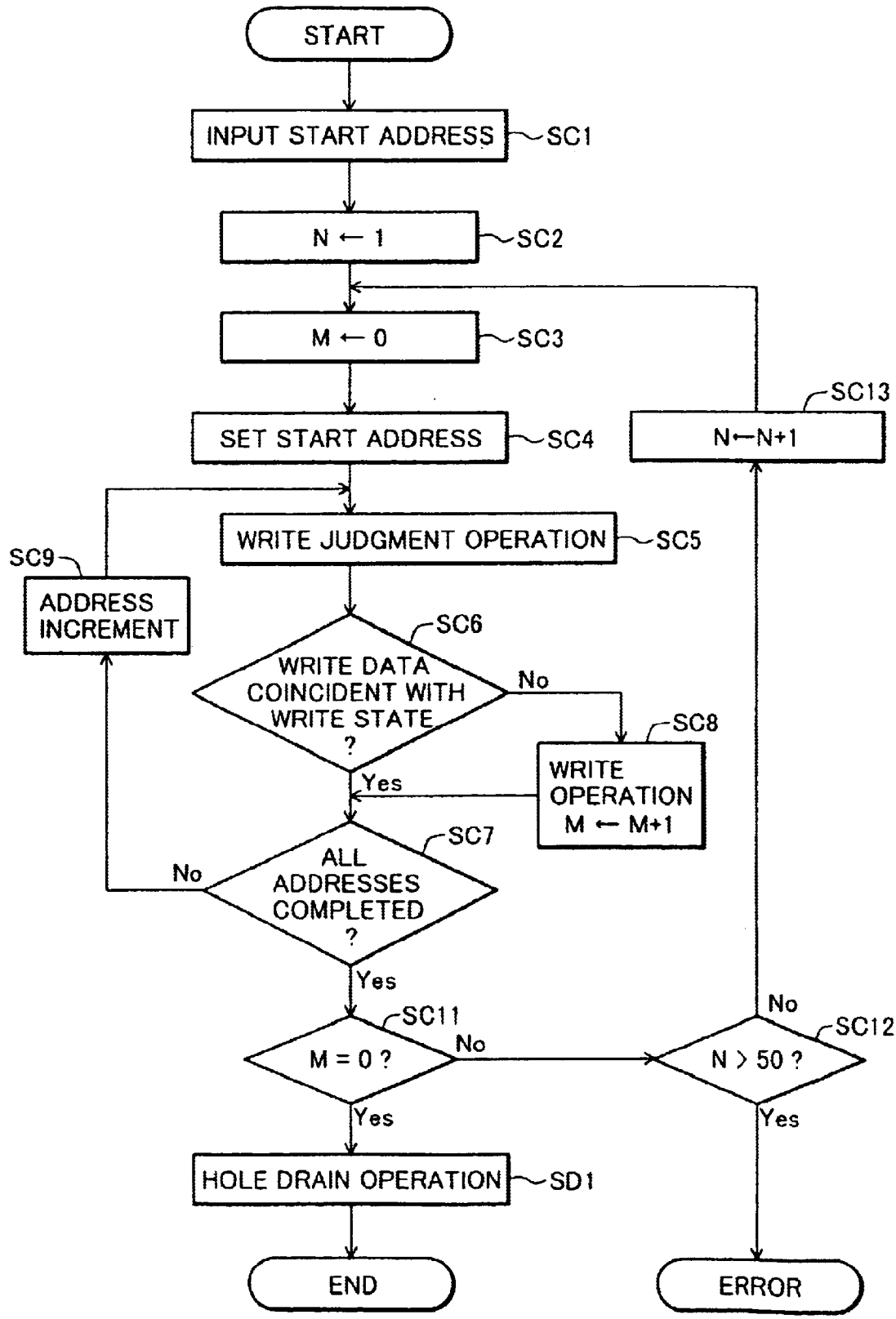
FIG. 16 is a flow chart illustrating a fourth driving method.

FIG. 16 is a flow chart illustrating the fourth driving method. In the third driving method, the hole drain operation is performed before it is judged at Step SC11 whether or not the write states of all memory cells are coincident with the data to be written. Namely, the hole drain operation is performed in the loop in which the write operation is repeated until the memory cells in which data "0" is written enter the write completion state. In contrast, according to the fourth driving method, after it is confirmed at Step SC11 that the write states of all memory cells become coincident with the data to be written, the flow advances to Step SD1 whereat the hole drain operation is performed. Namely, the hole drain operation is performed only once after all memory cells enter the write completion state.

If holes to be generated during the write operation are small in number, it is expected to be sufficient if the hole drain operation is performed only once after the write operation is completed for all memory cells. In this case, as compared to the third driving method, it is possible to shorten the write time.

Next, with reference to FIG. 17, a fifth driving method will be described.

Figure 17:
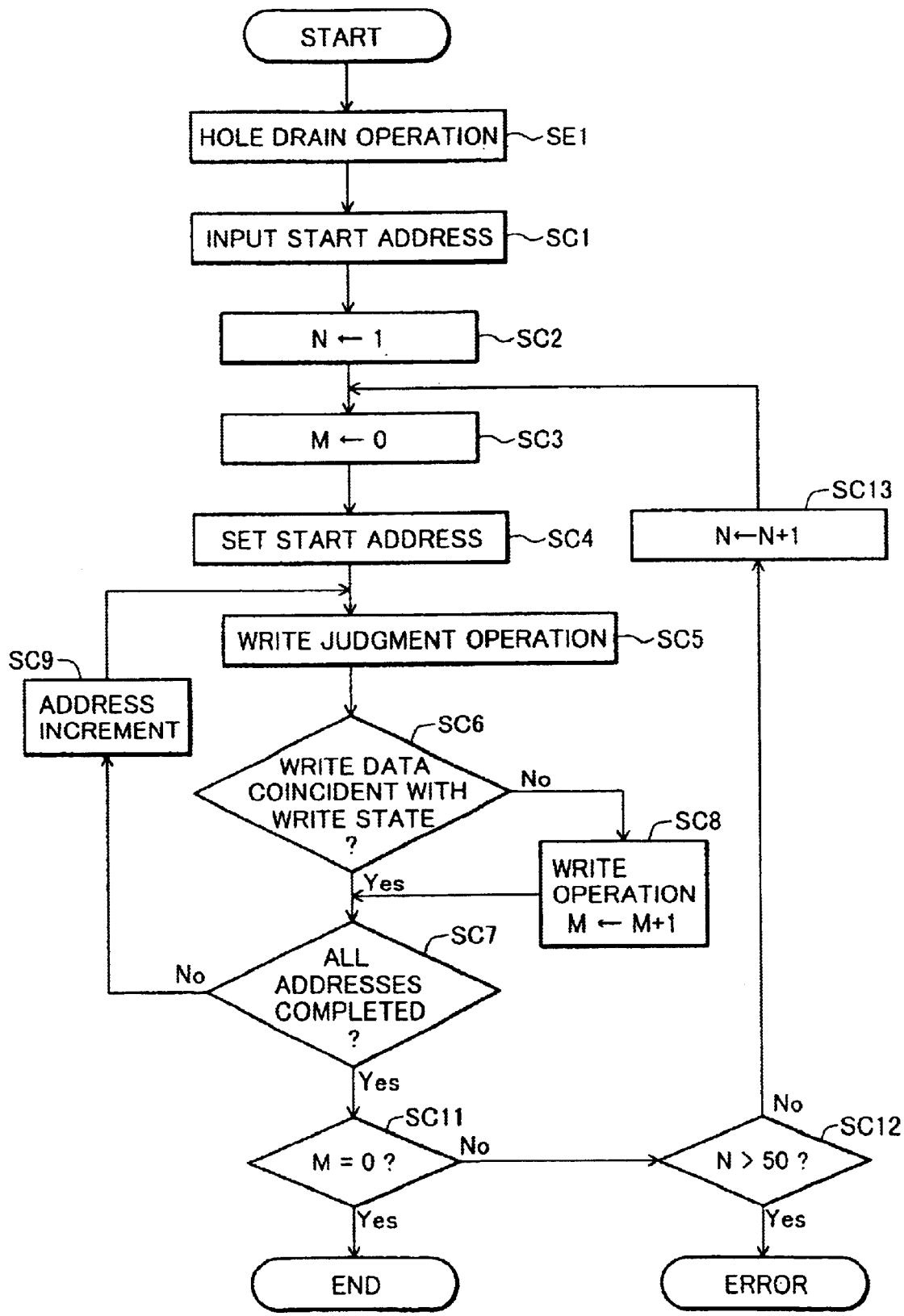
FIG. 17 is a flow chart illustrating a fifth driving method.

FIG. 17 is a flow chart illustrating the fifth driving method. In the fourth driving method, the hole drain operation is performed after Step SC11. In contrast, according to the fifth embodiment, the hole drain operation is performed only once at Step SE1 before the start address is input at Step SC1. The erase process is generally performed before the write process. Therefore, the fifth driving method is substantially equal to the second driving method in which the hole drain operation is performed only once after the erase operation is completed.

Next, with reference to FIG. 18 and FIGS. 19A to 19H, a SONOS type non-volatile memory according to a second embodiment of the invention will be described.

Figure 18:
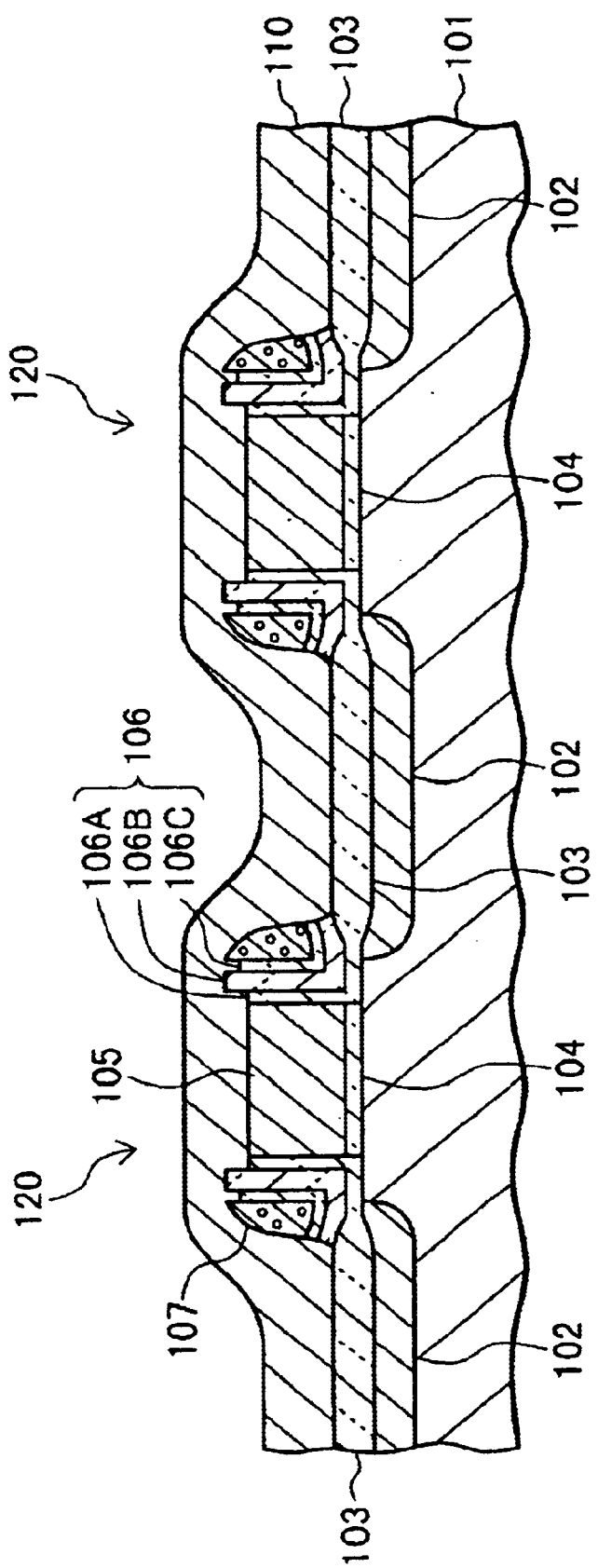
FIG. 18 is a cross sectional view of a SONOS type non-volatile memory according to a second embodiment.

FIG. 18 is a cross sectional view of a SONOS type non-volatile memory according to the second embodiment. The plan view and block diagram of this SONOS type non-volatile memory are similar to those of the SONOS type non-volatile memory of the first embodiment shown in FIGS. 7 and 9. The cross sectional view shown in FIG. 18 corresponds to the cross sectional view taken along one-dot chain line A8—A8 shown in FIG. 7.

In a surface layer of a p-type silicon substrate 101, a plurality of n-type impurity diffusion regions 102 are formed which extend along a direction perpendicular to the drawing sheet of FIG. 18. On the surface of the impurity diffusion region 102, a local insulating film 103 of silicon oxide is formed. The impurity diffusion region 102 corresponds to the bit line 1 shown in FIG. 7.

A gate insulating film 104 of silicon oxide is formed on the substrate surface between adjacent two impurity diffusion regions 102. The gate insulating film 104 is thinner than the local insulating film 103. The gate insulating film 104 is disposed spaced apart by some distance from opposite impurity diffusion regions 102. A gate electrode 105 of amorphous silicon is formed on the gate insulating film 104.

A laminated film (ONO film) 106 is formed on the side wall of the gate electrode 105 and on the substrate surface between the gate electrode 105 and impurity diffusion region

102. The ONO film 106 has a three-layer structure of a silicon oxide film 106A, a silicon nitride film 106B and a silicon oxide film 106C sequentially stacked in this order recited. The ONO film 106 is formed reflecting (conformal to) the side wall of the gate electrode 105 and the substrate surface.

The impurity diffusion region 102 enters laterally from the boarder of the ONO film 106 to the underside thereof with some depth, and does not reach the border of the gate electrode 105. The insulating film 103 enters laterally along the interface between the ONO film 106 and impurity diffusion region 102 at a shallower position than the boarder of the impurity diffusion region 102.

On the surface of the ONO film 106, a side wall spacer 107 of amorphous silicon is formed. The side wall spacer 107 faces the side wall of the gate electrode 105 and the surface of the silicon substrate 101, with the ONO film 106 being interposed therebetween.

A gate line (word line) 110 extending along a lateral direction as viewed in FIG. 18 is formed over the silicon substrate 101. A FET 120 is disposed in each cross area between the gate line 110 and a striped area between a pair of adjacent impurity diffusion regions 102. FET 120 uses one of the pair of impurity diffusion regions as the source region, and the other as the drain region. The gate line 110 is made of WSi or tungsten (W) and electrically connects the gate electrode 105 of FET 120 and side wall spacer 107. The gate line 110 also electrically connects the gate electrodes 105 of a plurality of FET's 120 disposed in line along a lateral direction as viewed in FIG. 18. The gate line 110 and impurity diffusion region 102 are electrically insulated by the local insulating film 103 in each cross area therebetween.

Next, with reference to FIGS. 19A to 19H, a method of manufacturing a semiconductor device of the second embodiment will be described.

Figure 19E:
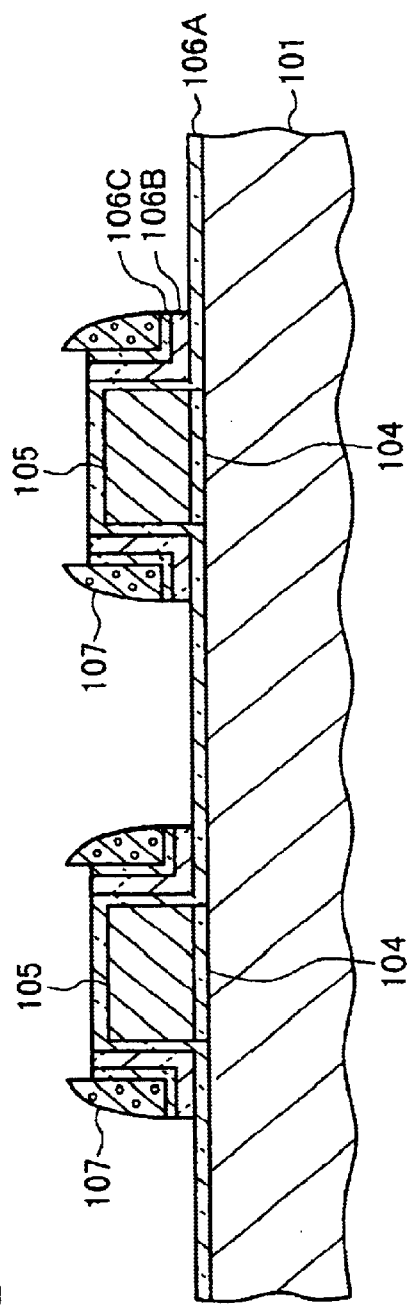

As shown in FIG. 19A, on the surface of a p-type silicon substrate 101, a field oxide film is formed by LOCOS to define active regions. The field oxide film does not appear in each of FIGS. 19A to 19H. A temperature of thermal oxidation is 900 to 1100° C. and a thickness of the field oxide film is 200 to 500 nm.

The surface of the silicon substrate 101 is oxidized at a temperature of 800 to 1100° C. to form a gate insulating film 104 of 5 to 10 nm in thickness on the surface of the active region. The gate insulating film 104 formed by this process is also used as a gate insulating film of a transistor in a peripheral circuit area other than the memory cell area.

On the surface of the gate insulating film 104, an amorphous silicon film of 50 to 100 nm is formed and patterned to leave a gate electrode 105. The gate electrode 105 is doped with phosphorous (P) and has an n-type conductivity. In this state, the gate electrode 105 is disposed between the bit lines 1 shown in FIG. 7 and extends along a direction parallel to the bit line 1.

The amorphous silicon film is grown by a chemical vapor deposition (CVD), and during this growth, phosphorous (P) is doped. A concentration of doped phosphorous is $2\times10^{20}$ to $3\times10^{21}$ cm$^{-3}$. Etching the amorphous silicon film may be performed by reactive ion etching (RIE) using a mixed gas of HCl and $O_2$. For this etching, the peripheral transistor area is covered with a resist pattern to leave the amorphous silicon film.

As shown in FIG. 19B, a hydrofluoric acid process is executed to remove the gate insulating film 104 in the area not covered with the gate electrode 105. The surface of the silicon substrate 101 is therefore exposed between a pair of adjacent gate electrodes 105.

As shown in FIG. 19C, a silicon oxide film 106A, a silicon nitride film 106B and a silicon oxide film 106C are sequentially formed over the whole surface of the substrate. These three layers form an ONO film 106. The silicon oxide film 106A is formed by thermally oxidizing the substrate surface at a substrate temperature of 800 to 1100° C. A thickness of the silicon oxide film 106A is 5 to 10 nm.

The silicon nitride film 106B can be formed by CVD at a growth temperature of 600 to 800° C. The silicon oxide film 106C is formed by wet oxidation of the surface layer of the silicon nitride film 106B at a temperature of 1000 to 1100° C. A thickness of the silicon nitride film immediately after the growth is 12 to 16 nm. A thickness of the silicon oxide film formed by oxidizing the silicon nitride film is 5 to 10 nm. The silicon nitride film may be grown thinner by CVD, and on this silicon nitride film, the silicon oxide film 106C may be grown by CVD.

The processes up to the state shown in FIG. 19D will be described. A non-doped polysilicon film is grown by CVD to a thickness of 50 to 100 nm, covering the whole substrate surface. This polysilicon film is anisotropically etched to leave side wall spacers 107 on the surface of the ONO film 106 in the area corresponding to the side walls of the gate electrode 105. The polysilicon film can be etched by RIE using a mixed gas of HCl and $O_2$.

As shown in FIG. 19E, the silicon oxide film 106C and the exposed region of the silicon nitride film 106B are etched. The silicon oxide film 106A is therefore exposed on the upper surface of the gate electrode 105 and on the surface of the silicon substrate 101. The silicon oxide film 106C and silicon nitride film 106B can be etched by RIE using a mixed gas of $CF_4$, $CHF_3$ and $O_2$. Under these etching conditions, the etching rate of the silicon nitride film is sufficiently faster than that of the silicon oxide film, so that the lowermost silicon oxide film 106A can be left with good reproductivity. Depending upon the thickness of the side wall spacer 107, the widths of the ONO films 106 covering the substrate surfaces on both sides of the gate electrode 105 can be determined.

Figure 19F:
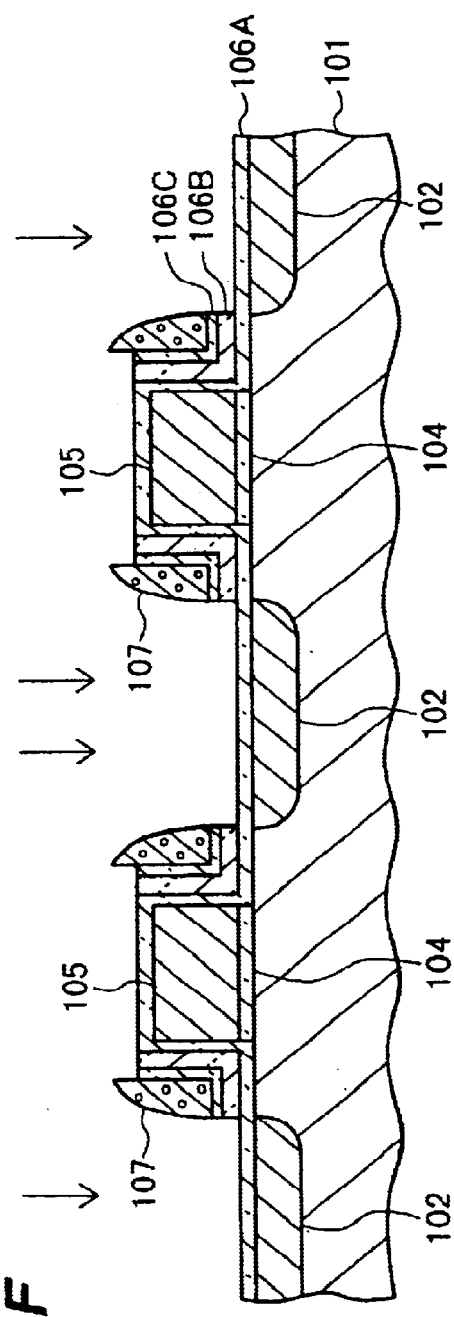

As shown in FIG. 19F, by using the gate electrodes 105 and side wall spacers 107 as a mask, arsenic (As) ions are implanted into the surface layer of the silicon substrate 101 under the conditions of an acceleration energy of 50 to 90 keV and a dose of $2\times10^{15}$ to $5\times10^{15}$cm$^{-2}$. Impurity diffusion regions 102 are therefore formed. In this case, arsenic (As) ions are also implanted into the area near the top of the side wall spacer 107 and into the surface layer of the gate electrode 105. The peripheral transistor area is being covered with the polysilicon film formed at the same time when the gate electrode 105 was formed, so that arsenic (As) ions are not implanted into this area. The impurity diffusion region 102 corresponds to the bit line 1 shown in FIG. 7.

Figure 19G:
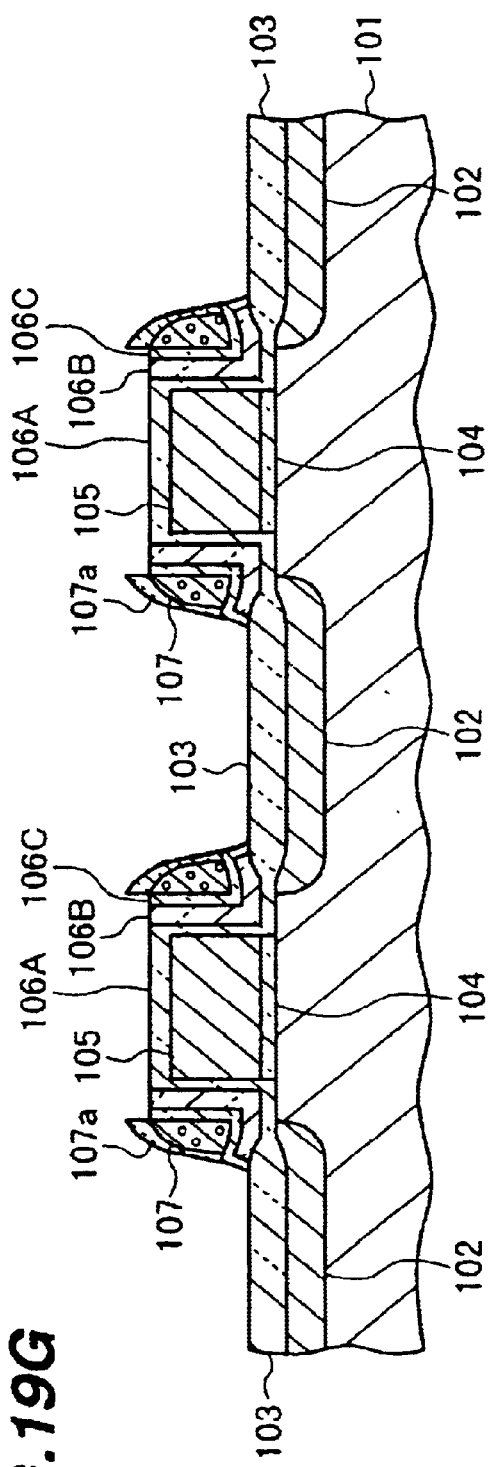

As shown in FIG. 19G, the surface of the silicon substrate 101 is locally wet-oxidized at a temperature of 800 to 1000° C. A local insulating film 103 made of silicon oxide and having a thickness of 40 to 60 nm is therefore formed on the surface of the impurity diffusion region 102. A silicon oxide film 107a is also formed on the surface of the side wall spacer 107. The silicon oxide film 106A left on the upper surface of the gate electrode 105 becomes thicker. An oxidation speed in the region doped with As is four to eight times as fast as that in the region not doped with As.

During the wet oxidation, arsenic (As) atoms in the impurity diffusion region 102 diffuse laterally so that the impurity diffusion region 102 extends under the silicon nitride film 106B. The boarders of the local insulating film 103 have bird's beaks extending under the silicon nitride film 106B. The tip of the bird's beak does not reach the distal end of the impurity diffusion region 102.

Figure 19H:
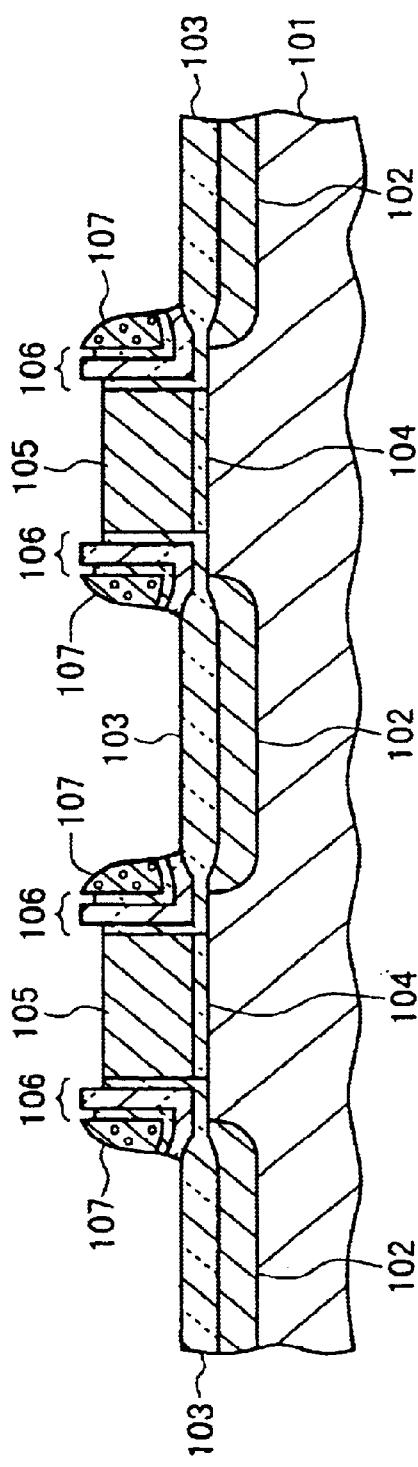

As shown in FIG. 19H, the silicon oxide films formed on the upper surface of the gate electrode 105 and on the surface of the side wall spacer 107 are removed by using hydrofluoric acid.

The processes up to the state shown in FIG. 18 will be described. A conductive film of WSi or W is formed by CVD to a thickness of 100 to 150 nm, covering the whole substrate surface. On the surface of this conductive film, a resist pattern corresponding to the word lines 2 shown in FIG. 7 is formed. The conductive film, gate electrode 105 and side wall spacer 107 in the area not covered with the resist pattern are etched. This etching can be performed by RIE using a mixed gas of HCl and $O_2$. With this etching, the gate electrode of a peripheral transistor is patterned at the same time. After the etching, the resist pattern is removed.

The gate insulating film 104 and insulating film 103 are exposed between adjacent two gate lines 110. By using the gate line 110 as a mask, boron (B) ions are implanted into the surface layer of the exposed gate electrode 104 under the conditions of acceleration energy of 50 to 80 keV and a dose of $3\times10^{12}$ to $1\times10^{13} cm^{-2}$. With this boron implantation, the channel stopper region 4 shown in FIG. 7 is formed.

In the second embodiment shown in FIG. 18, the silicon nitride film 106B is not disposed near at the central area of the channel region, but the silicon nitride film 106B is disposed only near at the boarder between the channel region and impurity diffusion region 102. By making electrons be trapped in this silicon nitride film 106B, data can be stored in the memory cell.

As above, it is not necessary to dispose the laminated gate insulating film on the whole channel region. It is sufficient that the laminated gate insulating film including the charge trap film is disposed at least in a martial area along the longitudinal direction of a path interconnecting one impurity diffusion region 102 and the adjacent impurity diffusion region 102.

By applying the first to fifth driving methods described with the first embodiment to the SONOS type non-volatile memory of the second embodiment shown in FIG. 18, the effects similar to the first embodiment can be expected. The structure of the second embodiment is expected to provide the following effects.

It is conceivable that data erase of a SONOS type non-volatile memory is performed by draining electrons in the charge trap film of silicon nitride into the depletion region near the drain. This depletion region is maintained by the potentials of the gate electrode and drain. Therefore, if electrons are trapped in the charge trap film above the central area of the channel region to which the depletion region does not extend, it becomes difficult to drain electrons. In the second embodiment, the charge trap film is not disposed above the central area of the channel region. Even electrons trapped in the charge trap film at any position can be drained relatively easily.

In the above embodiments, a SONOS type non-volatile memory has the gate insulating film of three layers including a substrate side insulating film, a charge trap film and a gate side insulating film. The substrate side insulating film prevents electrons from being injected from the channel region into the charge trap film during the read operation. The gate side insulating film prevents electrons from being injected from the gate electrode into the charge trap film during the erase operation. Therefore, the laminated gate insulating film can be two-layer structure by contriving the electric circuit. For example, the laminated gate insulating film can comprise the substrate side insulating film and the charge trap film, or the gate side insulating film and the charge trap film. Even if the gate insulating film has a two-layer structure, the above-described hole drain operation is valid.

In the above embodiments, silicon nitride is used as the charge trap film. $Ta_2O_2$ and $Al_2O_3$ may be used as the charge trap film instead of silicon nitride. There are a lot of bonds which are not connected to another atom in the silicon nitride film. These bonds which are not connected to another atom trap electrons. It is considered that the $Ta_2O_2$ or $Al_2O_3$ film traps electrons for a different reason.

The present invention has been described in connection with the preferred embodiments. The invention is not limited only to the above embodiments. It is apparent that various modifications, improvements, combinations, and the like can be made by those skilled in the art.

What is claimed is:

1. A method of driving a semiconductor memory, wherein:
    the semiconductor memory comprises:
        a semiconductor substrate;
        first and second impurity diffusion regions disposed in partial surface layers of the semiconductor substrate and being spaced apart by some distance;
        a gate electrode formed above a channel region defined between the first and second impurity diffusion regions; and
        a gate insulating film disposed between the channel region and the gate electrode, of the gate insulating film, a portion disposed at least in a partial area along the longitudinal direction of a path interconnecting the first and second impurity diffusion regions, having a lamination structure of a first insulating film, a charge trap film and a second insulating film sequentially stacked in this order, the charge trap film being made of insulating material easier to trap electrons than the first and second insulating films, and
    the method comprises a hole drain step of draining holes trapped in each film between the gate electrode and the channel region or at an interface between adjacent films, by applying a hole drain voltage to said gate electrode, the hole drain voltage being higher than a voltage applied to either the first or second impurity diffusion region.

2. A method of driving a semiconductor memory, wherein:
    the semiconductor memory comprises:
        a semiconductor substrate;
        a plurality of bit lines formed on said semiconductor substrate, said bit lines extending along a first direction and disposed in parallel;
        a plurality of word lines disposed on said semiconductor substrate, said word lines extending along a second direction crossing the first direction and being disposed in parallel and electrically insulated from said bit lines at each cross point between said bit lines and said word lines;
        FET's disposed in cross areas between each stripe area between a pair of adjacent bit lines and a corresponding word line, each of said FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of said bit lines, and the gate electrode being connected to a corresponding one of said word lines; and a control circuit for performing an erase operation, a hole drain operation, an erase judgment operation, a write operation and a write judgment operation, the erase operation draining electrons trapped in each charge trap film of said FET's by applying a first voltage to each of said plurality of bit lines and applying a negative erase voltage lower than the first voltage to each of said plurality of word lines, the hole drain operation draining holes trapped in each film between the gate electrode and the channel region of each of said FET's or at an interface between adjacent films, by applying a second voltage to each of said plurality of bit lines and applying a positive hole drain voltage higher than the second voltage to each of said plurality of word lines, the erase judgment operation applying a third voltage across a pair of bit lines corresponding to a selected FET among said FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among said FET's and applying a write voltage to a corresponding work line, to trap electrons in the charge trap film of the selected FET, and the write judgment operation applying a fifth voltage across a pair of bit lines corresponding to a selected FET among said FET's and applying a write judgment voltage to a corresponding word line, to compare a current flowing between the corresponding pair of bit lines with a reference current and judge whether the selected FET is in a write completion state or in a write incompletion state, and wherein the method comprises:
a step of performing the erase operation;
a step of performing the hole drain operation after the erase operation; and
a step of selecting each of said FET's subjected to the erase operation and performing the erase judgment operation, and if there is even one FET in the erase incompletion state, repeating the erase operation and the hole drain operation until all FET's enter the erase completion state.

3. A method of driving a semiconductor memory, wherein:
the semiconductor memory comprises:
a semiconductor substrate;
a plurality of bit lines formed on said semiconductor substrate, said bit lines extending along a first direction and disposed in parallel;
a plurality of word lines disposed on said semiconductor substrate, said word lines extending along a second direction crossing the first direction and being disposed in parallel and electrically insulated from said bit lines at each cross point between said bit lines and said word lines;

FET's disposed in cross areas between each stripe area between a pair of adjacent bit lines and a corresponding word line, each of said FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of said bit lines, and the gate electrode being connected to a corresponding one of said word lines; and a control circuit for performing an erase operation, a hole drain operation, an erase judgment operation, a write operation and a write judgment operation, the erase operation draining electrons trapped in each charge trap film of said FET's by applying a first voltage to each of said plurality of bit lines and applying a negative erase voltage lower than the first voltage to each of said plurality of word lines, the hole drain operation draining holes trapped in each film between the gate electrode and the channel region of each of said FET's or at an interface between adjacent films, by applying a second voltage to each of said plurality of bit lines and applying a positive hole drain voltage higher than the second voltage to each of said plurality of word lines, the erase judgment operation applying a third voltage across a pair of bit lines corresponding to a selected FET among said FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among said FET's and applying a write voltage to a corresponding work line, to trap electrons in the charge trap film of the selected FET, and the write judgment operation applying a fifth voltage across a pair of bit lines corresponding to a selected FET among said FET's and applying a write judgment voltage to a corresponding word line, to compare a current flowing between the corresponding pair of bit lines with a reference current and judge whether the selected FET is in a write completion state or in a write incompletion state, and wherein the method comprises:
a step of performing the erase operation;
a step of selecting each of said FET's subjected to the erase operation and performing the erase judgment operation, and if there is even one FET in the erase incompletion state, repeating the erase operation until all FET's enter the erase completion state; and a step of performing the hole drain operation if a judgment result by the erase judgment operation indicates that all FET's enter the erase completion state.

4. A method of driving a semiconductor memory, wherein:

the semiconductor memory comprises:
  a semiconductor substrate;
  a plurality of bit lines formed on said semiconductor substrate, said bit lines extending along a first direction and disposed in parallel;
  a plurality of word lines disposed on said semiconductor substrate, said word lines extending along a second direction crossing the first direction and being disposed in parallel and electrically insulated from said bit lines at each cross point between said bit lines and said word lines;
  FET's disposed in cross areas between each stripe area between a pair of adjacent bit lines and a corresponding word line, each of said FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of said bit lines, and the gate electrode being connected to a corresponding one of said word lines; and
  a control circuit for performing an erase operation, a hole drain operation, an erase judgment operation, a write operation and a write judgment operation, the erase operation draining electrons trapped in each charge trap film of said FET's by applying a first voltage to each of said plurality of bit lines and applying a negative erase voltage lower than the first voltage to each of said plurality of word lines, the hole drain operation draining holes trapped in each film between the gate electrode and the channel region of each of said FET's or at an interface between adjacent films, by applying a second voltage to each of said plurality of bit lines and applying a positive hole drain voltage higher than the second voltage to each of said plurality of word lines, the erase judgment operation applying a third voltage across a pair of bit lines corresponding to a selected FET among said FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among said FET's and applying a write voltage to a corresponding work line, to trap electrons in the charge trap film of the selected FET, and the write judgment operation applying a fifth voltage across a pair of bit lines corresponding to a selected FET among said FET's and applying a write judgment voltage to a corresponding word line, to compare a current flowing between the corresponding pair of bit lines with a reference current and judge whether the selected FET is in a write completion state or in a write incompletion state, and wherein the method comprises:
  a first step of sequentially selecting each FET from all FET's to be written and performing the write judgment operation for each selected FET, and if the selected FET is in the write incompletion state, performing the write operation for the selected FET;
  a second step of performing the hole drain operation; and
  a third step of repeating the first and second steps if there is even one FET in the write incompletion state.

5. A method of driving a semiconductor memory, wherein:

the semiconductor memory comprises:
  a semiconductor substrate;
  a plurality of bit lines formed on said semiconductor substrate, said bit lines extending along a first direction and disposed in parallel;
  a plurality of word lines disposed on said semiconductor substrate, said word lines extending along a second direction crossing the first direction and being disposed in parallel and electrically insulated from said bit lines at each cross point between said bit lines and said word lines;
  FET's disposed in cross areas between each stripe area between a pair of adjacent bit lines and a corresponding word line, each of said FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of said bit lines, and the gate electrode being connected to a corresponding one of said word lines; and
  a control circuit for performing an erase operation, a hole drain operation, an erase judgment operation, a write operation and a write judgment operation, the erase operation draining electrons trapped in each charge trap film of said FET's by applying a first voltage to each of said plurality of bit lines and applying a negative erase voltage lower than the first voltage to each of said plurality of word lines, the hole drain operation draining holes trapped in each film between the gate electrode and the channel region of each of said FET's or at an interface between adjacent films, by applying a second voltage to each of said plurality of bit lines and applying a positive hole drain voltage higher than the second voltage to each of said plurality of word lines, the erase judgment operation applying a third voltage across a pair of bit lines corresponding to a selected FET among said FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among said FET's and applying a write voltage to a corresponding work line, to trap electrons in the charge trap film of the selected FET, and the write judgment operation applying a fifth voltage across a pair of bit lines corresponding to a selected FET among said FET's and applying a write judgment voltage to a corresponding word line, to compare a current flowing between the corresponding pair of bit lines with a reference current and judge whether the selected FET is in a write completion state or in a write incompletion state, and wherein the method comprises:
  a first step of performing the hole drain operation;
  a second step of sequentially selecting each FET from all FET's to be written and performing the write judgment operation for each selected FET, and if the selected FET is in the write incompletion state, performing the write operation for the selected FET; and
  a third step of repeating the second step if there is even one FET in the write incompletion state.

6. A method of driving a semiconductor memory, wherein:

the semiconductor memory comprises:
  a semiconductor substrate;
  a plurality of bit lines formed on said semiconductor substrate, said bit lines extending along a first direction and disposed in parallel;
  a plurality of word lines disposed on said semiconductor substrate, said word lines extending along a second direction crossing the first direction and being disposed in parallel and electrically insulated from said bit lines at each cross point between said bit lines and said word lines;
  FET's disposed in cross areas between each stripe area between a pair of adjacent bit lines and a corresponding word line, each of said FET's including a pair of impurity diffusion regions of a first conductivity type, a channel region between the impurity diffusion regions, a gate insulating film formed on the channel region, and a gate electrode formed on the gate insulating film, of the gate insulating film, a portion disposed at least in a partial area along the longitudinal direction of a path interconnecting the pair of impurity diffusion regions, having a lamination structure of a first insulating film, a charge trap film and a second insulating film sequentially stacked in this order, the charge trap film being made of insulating material easier to trap electrons than the first and second insulating films, the pair of impurity diffusion regions being connected to a corresponding pair of said bit lines, and the gate electrode being connected to a corresponding one of said word lines; and a control circuit for performing an erase operation, a hole drain operation, an erase judgment operation, a write operation and a write judgment operation, the erase operation draining electrons trapped in each charge trap film of said FET's by applying a first voltage to each of said plurality of bit lines and applying a negative erase voltage lower than the first voltage to each of said plurality of word lines, the hole drain operation draining holes trapped in each film between the gate electrode and the channel region of each of said FET's or at an interface between adjacent films, by applying a second voltage to each of said plurality of bit lines and applying a positive hole drain voltage higher than the second voltage to each of said plurality of word lines, the erase judgment operation applying a third voltage across a pair of bit lines corresponding to a selected FET among said FET's and applying an erase judgment voltage to a corresponding word line, to compare a current flowing between the corresponding pair of bit lines with a reference current and judge whether the selected FET is in an erase completion state or in an erase incompletion state, the write operation applying a fourth voltage across a pair of bit lines corresponding to a selected FET among said FET's and applying a write voltage to a corresponding work line, to trap electrons in the charge trap film of the selected FET, and the write judgment operation applying a fifth voltage across a pair of bit lines corresponding to a selected FET among said FET's and applying a write judgment voltage to a corresponding word line, to compare a current flowing between the corresponding pair of bit lines with a reference current and judge whether the selected FET is in a write completion state or in a write incompletion state, and wherein the method comprises:
  a first step of sequentially selecting each FET from all FET's to be written and performing the write judgment operation for each selected FET, and if the selected FET is in the write incompletion state, performing the write operation for the selected FET;
  a second step of repeating the first step if there is even one FET in the write incompletion state; and
  a third step of performing the hole drain operation if all FET's to be written enter the write completion state.

* * * * *

UNITED STATES PATENT AND TRADEMARK OFFICE
CERTIFICATE OF CORRECTION

PATENT NO. : 6,735,127 B2
DATED : May 11, 2004
INVENTOR(S) : Satoshi Torii

It is certified that error appears in the above-identified patent and that said Letters Patent is hereby corrected as shown below:

<u>Title page, Item [54] and Column 1, lines 1-2,</u>
Title, correct to read -- METHOD OF DRIVING A SEMICONDUCTOR MEMORY --.

Signed and Sealed this

Twenty-third Day of November, 2004

JON W. DUDAS
*Director of the United States Patent and Trademark Office*